US011483000B2

(12) United States Patent
Choi et al.

(10) Patent No.: US 11,483,000 B2
(45) Date of Patent: Oct. 25, 2022

(54) INTERFACE CIRCUIT AND INTERFACE DEVICE

(71) Applicant: Samsung Electronics Co., Ltd., Suwon-si (KR)

(72) Inventors: Hwang Ho Choi, Busan (KR); Yungeun Nam, Anyang-si (KR); Sodam Ju, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/160,888

(22) Filed: Jan. 28, 2021

(65) Prior Publication Data

US 2022/0014195 A1 Jan. 13, 2022

(30) Foreign Application Priority Data

Jul. 9, 2020 (KR) .................. 10-2020-0084787

(51) Int. Cl.
*H03K 3/00* (2006.01)
*H03K 5/00* (2006.01)
(Continued)

(52) U.S. Cl.
CPC ... *H03K 19/018521* (2013.01); *G11C 7/1051* (2013.01); *G11C 11/4093* (2013.01); *H04L 25/0272* (2013.01)

(58) Field of Classification Search
None
See application file for complete search history.

(56) References Cited

U.S. PATENT DOCUMENTS 5,023,472 A 6/1991 Hashimoto et al.
5,537,067 A 7/1996 Carvajal et al.
(Continued)

FOREIGN PATENT DOCUMENTS

KR 10-2008-0003033 A 1/2008
KR 10-2019-0050685 A 5/2019

*Primary Examiner* — Kenneth B Wells
(74) *Attorney, Agent, or Firm* — Harness, Dickey & Pierce, P.L.C.

(57) ABSTRACT

An interface circuit includes a first switch element connected to a first power supply node, supplying a first power supply voltage, and an output node, transmitting an output signal, and controlled by a first input signal, a second switch element connected to a second power supply node, supplying a second power supply voltage, lower than the first power supply voltage, and the output node and controlled by a second input signal, different from the first input signal, a first resistor connected between the first power supply node and the first switch element, a second resistor connected between the second power supply node and the second switch element, a first capacitor connected between the first resistor and the first switch element and charged and discharged by a first control signal, a second capacitor connected between the second resistor and the second switch element and charged and discharged by a second control signal, and a buffer circuit configured to output the first control signal and the second control signal and connected to a third power supply node, supplying a third power supply voltage, through a first variable resistor and connected to a fourth power supply node, supplying a fourth power supply voltage, lower than the third power supply node, through a second variable resistor.

20 Claims, 26 Drawing Sheets

(51) Int. Cl.
*H03K 5/12* (2006.01)
*H03K 5/1252* (2006.01)
*H03K 19/0185* (2006.01)
*G11C 7/10* (2006.01)
*G11C 11/4093* (2006.01)
*H04L 25/02* (2006.01)

(56) References Cited

U.S. PATENT DOCUMENTS

| | | |
|---|---|---|
| 7,652,538 B2 | 1/2010 | Choi |
| 7,876,129 B2 | 1/2011 | Lu et al. |
| 7,924,066 B2 | 4/2011 | Gagne et al. |
| 7,999,579 B2 | 8/2011 | Lee et al. |
| 8,633,738 B2 | 1/2014 | Chen et al. |
| 10,516,389 B2 * | 12/2019 | Park ..................... G11C 7/1057 |
| 10,804,928 B1 * | 10/2020 | Tamura .................... H03M 3/50 |
| 11,005,462 B1 * | 5/2021 | Park ............... H03K 19/017509 |
| 2006/0071688 A1 | 4/2006 | Uenishi |
| 2019/0140627 A1 | 5/2019 | Park |

* cited by examiner ness of data processed by electronic devices has increased, interface circuits capable of providing high-speed communications between semiconductor devices are proposed. In addition, as the number and types of semiconductor devices included in electronic devices have increased, various methods of improving an operation of an interface circuit are provided.

INTERFACE CIRCUIT AND INTERFACE DEVICE

CROSS-REFERENCE TO RELATED APPLICATION(S)

This application claims benefit of priority to Korean Patent Application No. 10-2020-0084787 filed on Jul. 9, 2020 in the Korean Intellectual Property Office, the disclosure of which is incorporated herein by reference in its entirety.

BACKGROUND

The present disclosure relates to an interface circuit and an interface device.

Semiconductor devices, included in an electronic device, may exchange data with each other through an interface circuit. As capacity of data processed by electronic devices has increased, interface circuits capable of providing high-speed communications between semiconductor devices are proposed. In addition, as the number and types of semiconductor devices included in electronic devices have increased, various methods of improving an operation of an interface circuit are provided.

SUMMARY

Example embodiments provide an interface circuit and an interface device which may adjust a slew rate of an input signal in consideration of characteristics of a channel for communications between semiconductor devices to improve communications performance and an eye margin of a signal.

According to example embodiments, an interface circuit includes a first switch element connected to a first power supply node, supplying a first power supply voltage, and an output node, transmitting an output signal, and controlled by a first input signal, a second switch element connected to a second power supply node, supplying a second power supply voltage, lower than the first power supply voltage, and the output node and controlled by a second input signal, different from the first input signal, a first resistor connected between the first power supply node and the first switch element, a second resistor connected between the second power supply node and the second switch element, a first capacitor connected between the first resistor and the first switch element and charged and discharged by a first control signal, a second capacitor connected between the second resistor and the second switch element and charged and discharged by a second control signal, and a buffer circuit configured to output the first control signal and the second control signal and connected to a third power supply node, supplying a third power supply voltage, through a first variable resistor and connected to a fourth power supply node, supplying a fourth power supply voltage, lower than the third power supply voltage, through a second variable resistor.

According to example embodiments, an interface device includes a plurality of interface circuits, each including a first switch element and a second switch element, connected to each other in series, a first capacitor connected between the first switch element and a first power supply node, a second capacitor connected between the second switch element and a second power supply node, and a buffer configured to charge and discharge the first capacitor and the second capacitor, and a controller configured to control the first switch element and the second switch element to determine an output signal of each of the plurality of interface circuits and configured to adjust a slew rate of a control signal, output to the first capacitor and the second capacitor, to determine a slew rate of the output signal.

According to example embodiments, an interface circuit includes a first switch element configured to receive a first power supply voltage from a first power supply node and turned on and turned off by a first input signal, a second switch element configured to receive a second power supply voltage, lower than the first power supply voltage, from a second power supply node and turned on and turned off by a second input signal, a first capacitor having a first node, connected to a first common node between the first switch element and the first power supply node, and a second node receiving a control signal having the same phase as the first input signal, and a second capacitor having a first node, connected to a second common node between the second switch element and the second power supply node, and a second node receiving the control signal. A slew rate of an output signal, output from an output node on which the first switch element and the second switch element are connected to each other, is determined by a slew rate of the control signal.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, example embodiments will be described with reference to the accompanying drawings.

Figure 1:
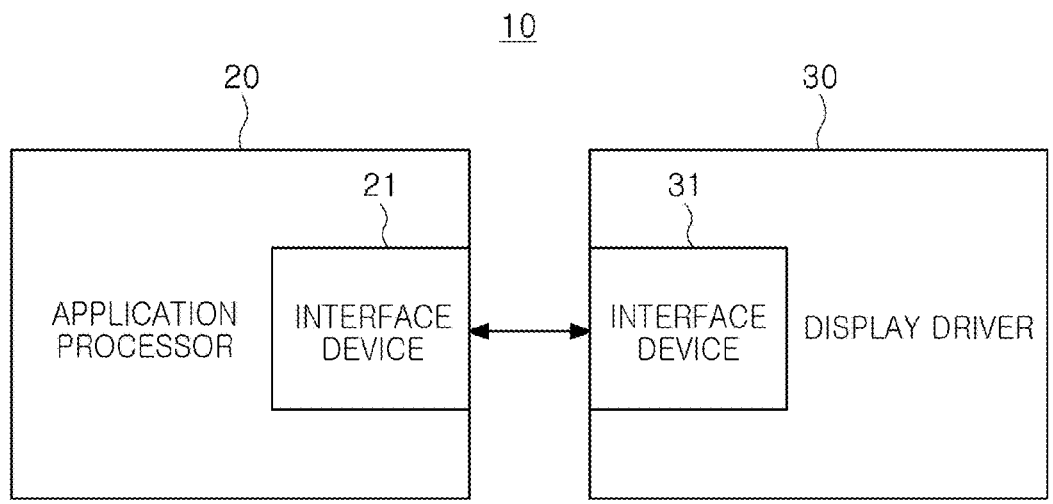
FIGS. 1 to 3 are schematic diagrams illustrating an electronic device including an interface device according to example embodiments.
Figure 2:
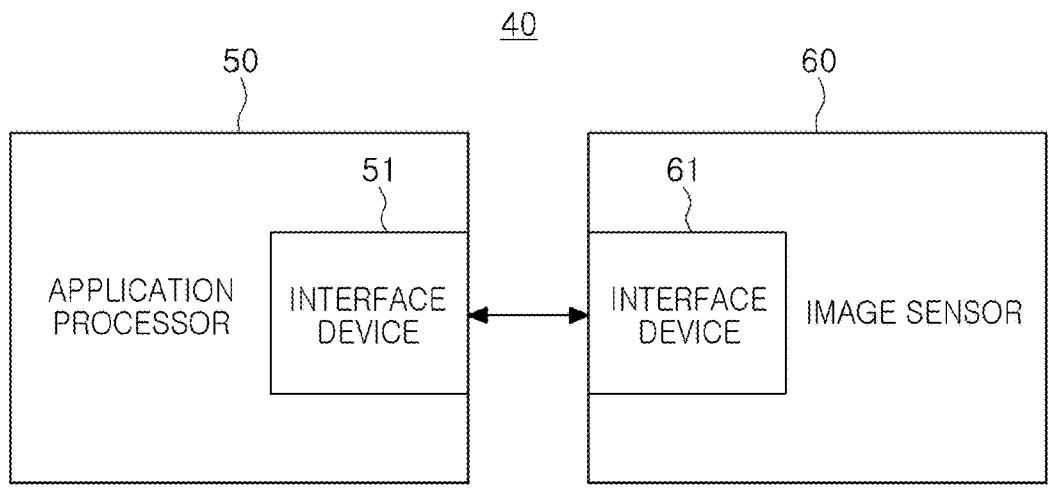
Figure 3:
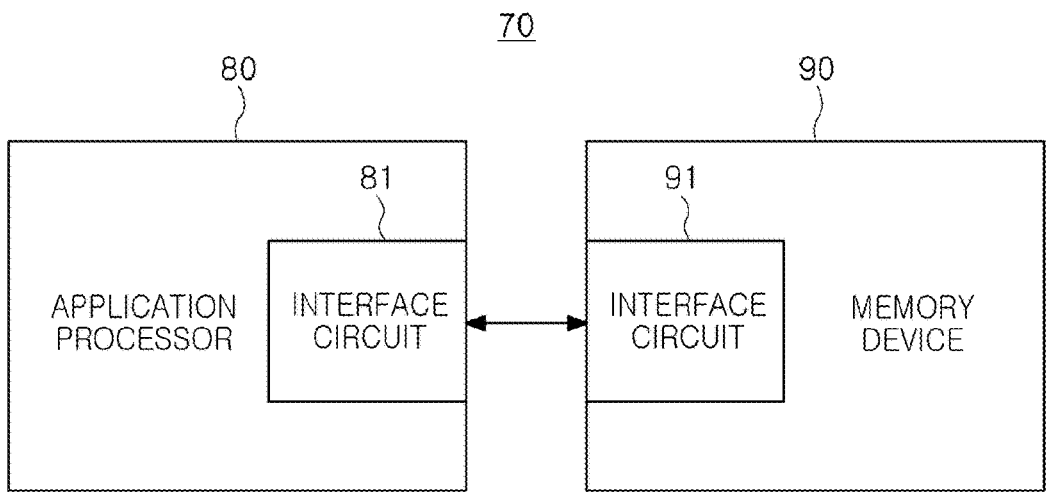

FIGS. 1 to 3 are schematic diagrams illustrating an electronic device including an interface device according to example embodiments.

Referring to FIG. 1, an electronic device 10 may include an application processor 20 and a display driver 30. An interface device 21 of the application processor 20 may exchange data with an interface device 31 of the display driver 30. Each of the interface devices 21 and 31 may include a plurality of interface circuits.

The interface devices 21 and 31 may exchange data with each other according to a predetermined or alternatively, desired protocol. As an example, the interface device 21 of the application processor 20 and the interface device 31 of the display driver 30 may exchange data according to a protocol defined in a mobile industry processor interface (MIPI) standard. Each of the interface devices 21 and 31 may include a transmission circuit and a reception circuit.

Referring to FIG. 2, in an electronic device 40, an application processor 50 may exchange data with an image sensor 60. An interface device 51 of the application processor 50 and an interface device 61 of the image sensor 60 may exchange data with each other. Similarly to what is described with reference to FIG. 1, each of the interface devices 51 and 61 may include a plurality of interface circuits for data exchange.

Referring to FIG. 3, in an electronic device 70, the application processor 80 may exchange data with a memory device 90. An interface device 81 of the application processor 80 and an interface device 91 of the memory device 90 may exchange data, a command, an address, and/or the like, with each other. Similarly to what are described with reference to FIGS. 1 and 2, the interface devices 81 and 91 may include a plurality of interface circuits for data exchange.

An interface circuit, included in at least one of the interface devices 21, 31, 51, 61, 81, 91 according to example embodiments, may have a function to adjust a slew rate of an output signal. Controllers, included in the application processor 20, 50, 80, the display driver 30, the image sensor 60, and the memory device 90 may control the interface devices 21, 31, 51, 61, 81 and 91 to determine the slew rate of the output signal. In some example embodiments, the controllers may increase the slew rate of the output signal when it is determined that higher-speed data transmission is required. In addition, the controllers may adjust the slew rate of the output signal according to loads of channels through which data exchanges between the interface devices 21, 31, 51, 61, 81, and 91.

Figure 4:
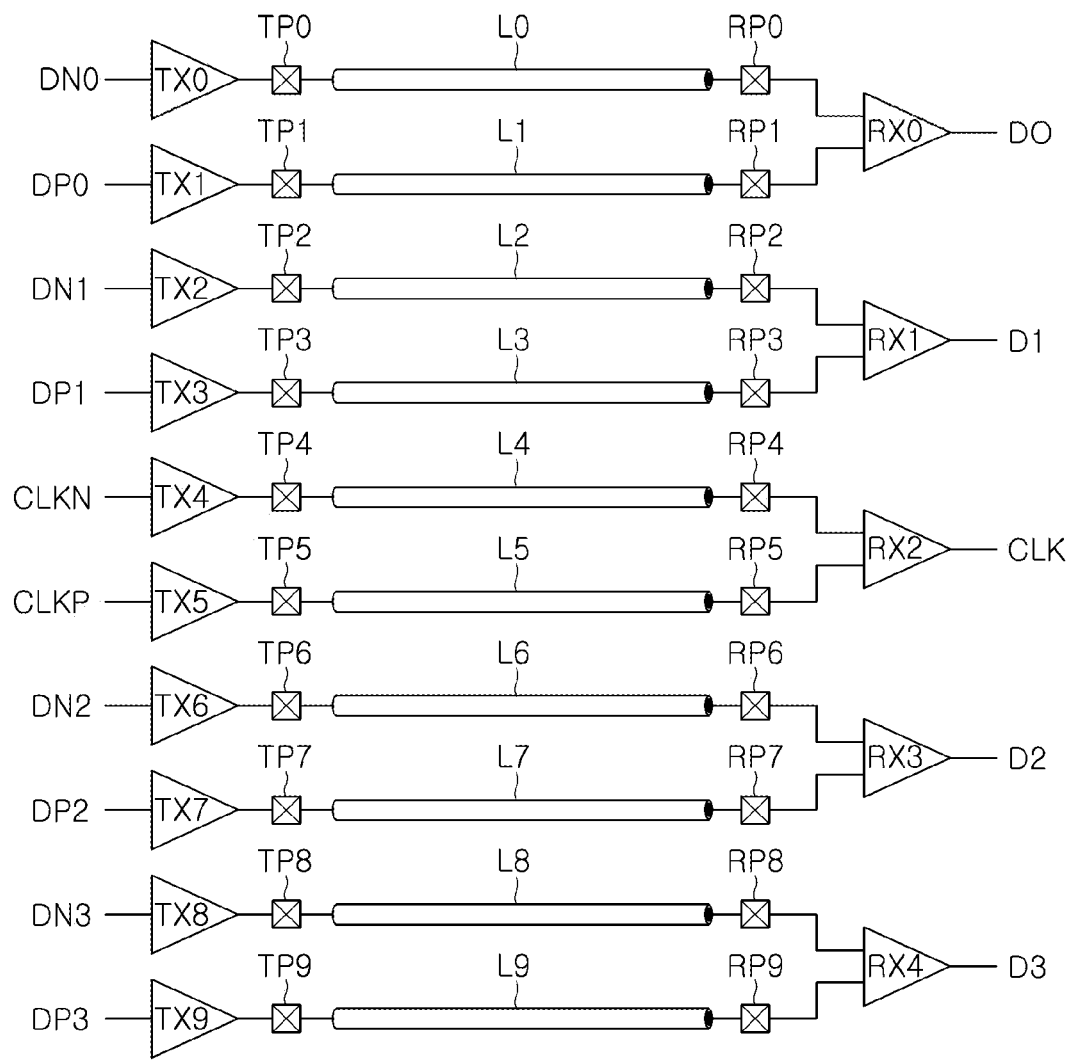
FIGS. 4 and 5 are views illustrating an operation of an interface device according to example embodiments.
Figure 5:
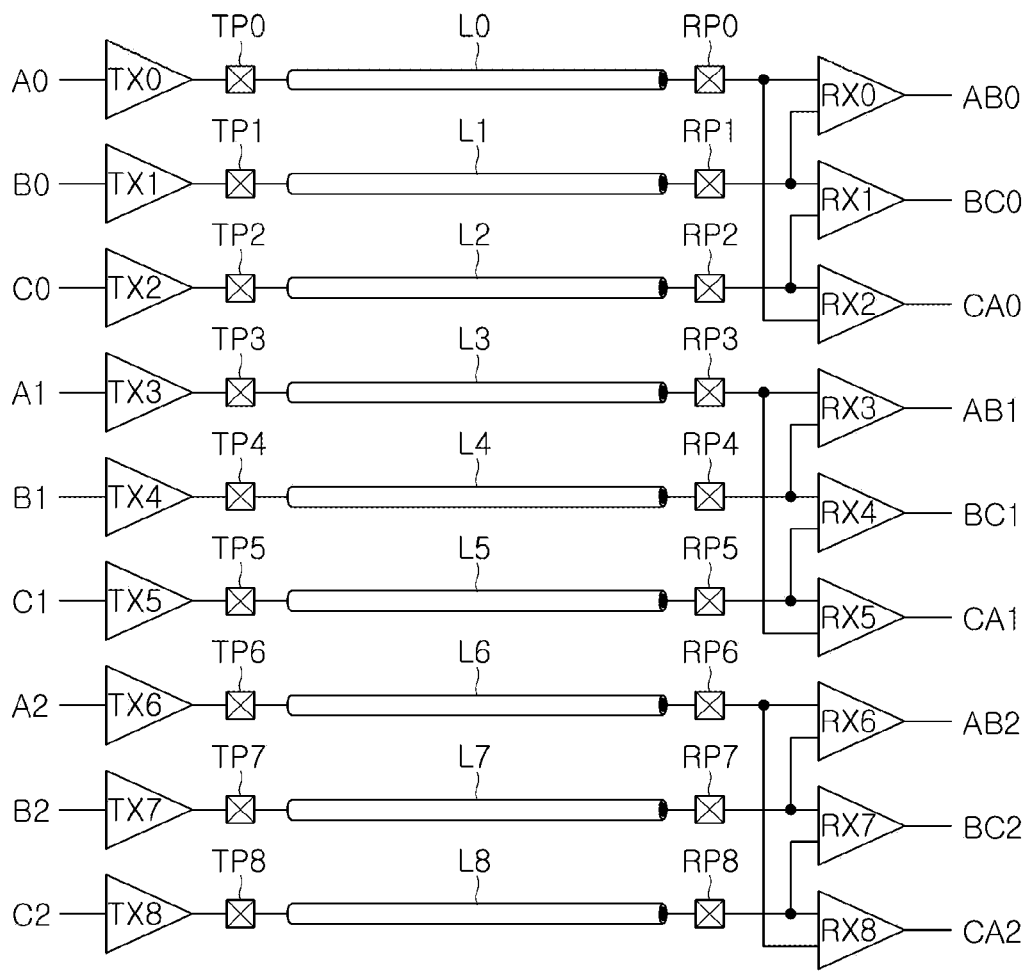

FIGS. 4 and 5 are views illustrating an operation of an interface device according to example embodiments.

FIG. 4 may be a view illustrating an operation of an interface device 100 transmitting data and clock signals in a differential signaling scheme. For example, example embodiments described with reference to FIG. 4 may be applied to a D-PHY interface according to the MIPI standard. Referring to FIG. 4, a plurality of transmitters TX0 to TX9 may output pieces of data DN0 to DN3 and DP0 to DP3 and clock signals CLKN and CLKP through a plurality of transmission pads TP0 to TP9.

The transmission pads TP0 to TP9 may be connected to a plurality of reception pads RP0 to RP9 through a plurality of data lanes L0 to L9, and the reception pads RP0 to RP9 may be connected to a plurality of receivers RX0 to RX4. For example, each of the receivers RX0 to RX4 may be connected to a pair of reception pads, among the reception pads RP0 to RP9, and the receivers RX0 to RX4 may generate pieces of data D0 to D3 and a clock signal CLK in the differential signaling scheme. Therefore, in example embodiments illustrated in FIG. 4, ten transmission pads TP0 to TP9, ten data lines L0 to L9, and ten reception pads RP0 to RP9 may be required to transmit data in the differential signaling scheme. According to example embodiments, dummy pads may be added to the transmission pads TP0 to TP9 and the reception pads RP0 to RP9 to achieve an electrical shielding effect. As an example, the interface device 100 illustrated in FIG. 4 may be applied to an application processor, a display driver, an image sensor, a memory device, and/or the like.

FIG. 5 may be a view illustrating an operation of an interface device 110 transmitting data in a single-ended signaling scheme. For example, example embodiments described with reference to FIG. 5 may be applied to a C-PHY interface according to the MIPI standard. Referring to FIG. 5, a plurality of transmitters TX0 to TX8 may output pieces of data A0 to C0, A1 to C1, and A2 to C2 through a plurality of transmission pads TP0 to TP8. Since image data is output in the single-ended signaling scheme, an additional data lane for outputting a clock signal may not be present in an interface according to example embodiments illustrated in FIG. 5.

The transmission pads TP0 to TP8 may be connected to a plurality of reception pads RP0 to RP8 through a plurality of data lanes L0 to L8, and the reception pads RP0 to RP8 may be connected to a plurality of receivers RX0 to RX8. According to the pieces of data A0 to C0, A1 to C1, and A2 to C2, the transmission pads TP0 to TP8 may be divided into a plurality of groups TP0 to TP2, TP3 to TP5, and TP6 to TP8, and the reception pads RP0 to RP8 may also be divided into a plurality of groups RP0 to RP2, RP3 to RP5, and RP6 to RP8. Each of the receivers RX0 to RX8 may receive a pair of reception pads RP0 to RP8, among the reception pads RP0 to RP8 included in each of the groups RP0 to RP2, RP3 to RP5, and RP6 to RP8. As an example, the first receiver RX0 may output a difference between a signal A0 and a signal B0, and the second receiver RX1 may output a difference between the signal B0 and a signal C0. The third receiver RX2 may output a difference between the signal C0 and the signal A0.

In example embodiments illustrated in FIG. 5, nine transmission pads TP0 to TP8, nine data lanes L0 to L8, and nine reception pads RP0 to RP8 may be required to transmit data in the single-ended signaling scheme. However, even in the single-ended signaling scheme, dummy pads may be added to achieve an electrical shielding effect according to example embodiments. The interface device 110, illustrated in FIG. 5, may also be applied to an application processor, a display driver, an image sensor, a memory device, and/or the like.

The interface devices 100 and 110 according to example embodiments described with reference to FIGS. 4 and 5 may also be applied to communications between devices, other than an application processor, a display driver, an image sensor, and a memory device. As an example, the interface devices 100 and 110 may be applied to interfaces such as PCI-Express, USB, display ports, and/or the like.

As capacity of data transmitted by the interface devices 100 and 110 is gradually increased and a data transmission rate required by the system is increased, noise characteristics of signals output by the interface devices 100 and 110 may be deteriorated or an eye margin may be reduced. In example embodiments, noise characteristics of the interface devices 100 and 110 may be improved by connecting a capacitance between a resistor and a switch element in the interface devices 100 and 110 and adjusting a slew rate of a signal charging and discharging the capacitor. In addition, a slew rate of signal charging and discharging a capacitor may be adjusted in consideration of a load of a channel, through which the interface devices 100 and 110 exchange data with each other, to reduce or prevent overshoot from occurring and to operate the interface devices 100 and 110 with improved or optimal characteristics.

Figure 6:
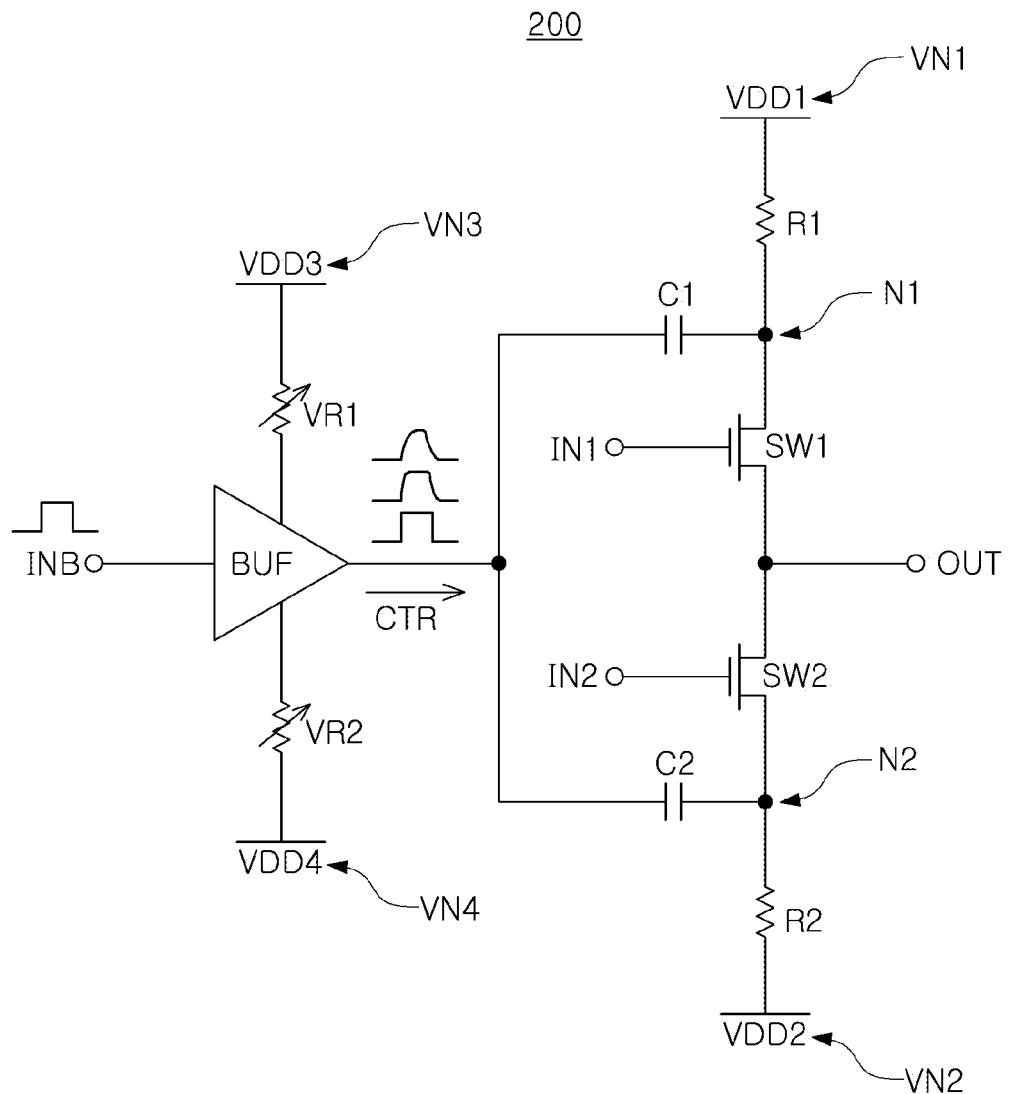
FIG. 6 is a schematic circuit diagram of an interface circuit according to example embodiments.

FIG. 6 is a schematic circuit diagram of an interface circuit according to example embodiments.

Referring to FIG. 6, an interface circuit 200 according to example embodiments may include a first switch element SW1 and a second switch element SW2, a first capacitor C1, a second capacitor C2, a first resistor R1, a second resistor R2, and/or the like. The first switch element SW1 and the second switch element SW2 may be connected between a first power supply node VN1 and a second power supply node VN2. Each of the first switch element SW1 and the second switch element SW2 may be implemented as an NMOS transistor.

The first switch element SW1 may be connected to the first power supply node VN1 through the first resistor R1, and the second switch element SW2 may be connected to the second power supply node VN1 through the second resistor R2. A first power supply voltage VDD1 may be supplied through the first power supply node VN1, and a second power supply voltage VDD2 may be supplied through the second power supply node VN2. In some example embodiments, the first power supply voltage VDD1 may be higher than the second power supply voltage VDD2.

In example embodiments illustrated in FIG. 6, a node between the first resistor R1 and the first switch element SW1 may be defined as a first node N1, and a node between the second resistor R2 and the second switch element SW2 may be defined as a second node N2. An output node may be defined between the first switch element SW1 and the second switch element SW2. An output signal OUT, output to an output node, may be determined by a first input signal IN1, controlling the first switch element SW1, and a second input signal IN2 controlling the second switch element SW2.

A first capacitor C1 may be connected to the first node N1, and a second capacitor C2 may be connected to the second node N2. In example embodiments illustrated in FIG. 6, charging and discharging of the first capacitor C1 and the second capacitor C2 may be controlled by a control signal CTR. The control signal CTR may be an output signal of a buffer BUF, and the buffer BUF may receive a buffer input signal INB to output the control signal CTR.

In some example embodiments, each of the first capacitor C1 and the second capacitor C2 may be implemented as a MOS capacitor, or the like. When each of the first capacitor C1 and the second capacitor C2 is a MOS capacitor, the control signal CTR may be input to a gate terminal of each of the transistors providing the first capacitor C1 and the second capacitor C2.

The buffer BUF may receive a third power supply voltage VDD3 and a fourth power supply voltage VDD4, required for operation, through a first variable resistor VR1 and a second variable resistor VR2. As an example, the third power supply voltage VDD3 may be higher than the fourth power supply voltage VDD4 and may the same as the first power supply voltage VDD1, and the fourth power supply voltage VDD4 may be the same as the second power supply voltage VDD2. The third power supply voltage VDD3 may be supplied from a third power supply node VN3, and the fourth power supply voltage VDD4 may be supplied from a fourth power supply node VN4.

In some example embodiments, a slew rate of the control signal CTR may be determined by variable resistors VR1 and VR2 connected to the buffer BUF. As an example, when resistances of the variable resistors VR1 and VR2 are decreased, the slew rate of the control signal CTR may be increased. When the resistances of the variable resistors VR1 and VR2 may be increased, the slew rate of the control signal CTR may be decreased.

The slew rate of the control signal CTR may affect the slew rate of the output signal OUT. For example, under the assumption that other conditions are the same, when the slew rate of the control signal CTR is increased to increase rates at which the first capacitor C1 and the second capacitor C2 are charged and discharged, a slew rate of the output signal OUT may be increased. When the slew rate of the control signal CTR is decreased to decrease the rates at which the first capacitor C1 and the second capacitor C2 are charged and discharged, the slew rate of the output signal OUT may be decreased.

In general, when high-speed data communications needs to be supported, the slew rate of the output signal OUT in the interface circuit 200 may be increased. However, when the slew rate of the output signal OUT is increased without consideration of a load of a channel connected to an output node of the interface circuit 200, overshoot, or the like, may occur in the output signal OUT and an eye margin of the output signal OUT may be reduced. In some example embodiments, the slew rate of the control signal CTR may be determined in consideration of a communications environment to which the interface circuit 200 is applied, and thus, the slew rate of the output signal OUT may be adjusted to improve the eye margin of the output signal OUT and communications performance of a semiconductor device to which the interface circuit 200 is applied.

Capacitance of each of the first capacitor C1 and the second capacitor C2 may be variously selected. As an example, the first capacitor C1 and the second capacitor C2 may have the same capacitance. In addition, each of the first capacitor C1 and the second capacitor C2 may have fixed capacitance. According to example embodiments, each of the first capacitor C1 and the second capacitor C2 may have tunable variable capacitance.

When the interface circuit 200 transmits data in a differential signaling scheme, a phase of a first input signal IN1 may be opposite to a phase of second input signal IN2. In some example embodiments, the output signal OUT may vary between a first level and a second level higher than the first level. As an example, when the first switch element SW1 is turned on by the first input signal IN1 and the second switch element SW2 is turned off by the second input signal IN2, the output signal OUT may have the second level. In addition, when the first switch element SW1 is turned off by the first input signal IN1 and the second switch element SW2 is turned on by the second input signal IN2, the output signal OUT may have the first level.

When the output signal OUT is decreased from the second level to the first level or is increased from the first level to the second level, the slew rate of the output signal OUT may be affected by magnitudes of the first input signal IN1 and the second input signal IN2, a slew rate of the control signal CTR charging and discharging the first capacitor C1 and the second capacitor C2, parasitic elements present in the respective elements and the nodes VN1, VN2, N1, and N2, and/or the like. In some example embodiments, as described above, the slew rate of the control signal CTR may be adjusted to control charging and discharging of the first capacitor C1 and the second capacitor C2, and thus, the slew rate of the output signal OUT may be controlled.

On the other hand, when the interface circuit 200 transmits data in a single-ended signaling scheme, a phase of the first input signal IN1 may not be opposite to a phase of the second input signal IN2. During at least a portion of time, the first input signal IN1 and the second input signal IN2 may have the same value, and the output signal OUT may have a first level, a second level higher than the first level, and a third level higher than the second level.

Even when the interface circuit 200 transmits data in the single-ended signaling scheme, the slew rate of the control signal CTR charging and discharging the first capacitor C1 and the second capacitor C2 may be adjusted to increase or decrease the slew rate of the output signal OUT. According to example embodiments, when the interface circuit 200 operates in the single-ended signaling scheme, the first capacitor C1 and the second capacitor C2 may be charged and discharged by different control signals.

When the interface circuit 200 according to example embodiments illustrated in FIG. 6 is defined as a unit circuit, a plurality of unit circuits may be connected to a single output pad, sensing the output signal OUT, in an actually implemented interface device. As an example, one or more first unit circuits and one or more second unit circuits may be connected to one output pad. As an example, values of resistors R1 and R2 and capacitors C1 and C2, included in the first unit circuit, may be the same as or different from values of resistors R1 and R2 and capacitors C1 and C2 included in the second unit circuit.

In some example embodiments, five first unit circuits and two second unit circuits may be connected to a single output pad. For example, the sum of turn-on resistances of a first resistor R1 and a first switch element SW1, included in each of the first unit circuits, may be half of the sum of turn-on resistances of a first resistor R1 and a first switch element SW1 included in each of the second unit circuits. Similarly, the sum of turn-on resistances of a second resistor R2 and a second switch element SW2, included in each of the first unit circuits, may be half of the sum of turn-on resistances of a second resistor R2 and a second switch element SW2 included in each of the second unit circuits. In an actual operation, the first switch element SW1 and the second switch element SW2, included in each of the first unit circuits and the second unit circuits, may be appropriately controlled to set a required resistance value.

In some example embodiments, a size of each of the first switch element SW1 and the second switch element SW2 may be determined according to the above-described resistance condition. As an example, under the assumption that a first switch element and a second switch element included in each of the first unit circuits and each of the second unit circuits have the same gate length, a gate width of the first switch element included in each of the first unit circuits may be twice a gate width of the first switch element included in each of the second unit circuits. In the above example, the gate width may be defined in a direction intersecting the gate length. Similarly, the second switch element included in each of the first unit circuits may be twice the gate width of the second switch element included in each of the second unit circuits.

Under the assumption of the number of the first unit circuits and the second unit circuits as described above, a first capacitor C1 included in the first unit circuit may be about twice the capacitance of a first capacitor C1 included in the second unit circuit. Also, a second capacitor C2 included in the first unit circuit may be about twice the capacitance of a second capacitor C2 included in the second unit circuit.

When data is exchanged in a single-ended signaling scheme, at least three output pads may be required to transmit data, as described above with reference to FIG. 5. Output signals, output from the three output pads, have different levels and may have first to third levels, as described above. As an example, the number of actually operating unit circuits, among a plurality of unit circuits connected to the output pad, may vary depending on an output signal OUT output through the output pad.

Figure 7:
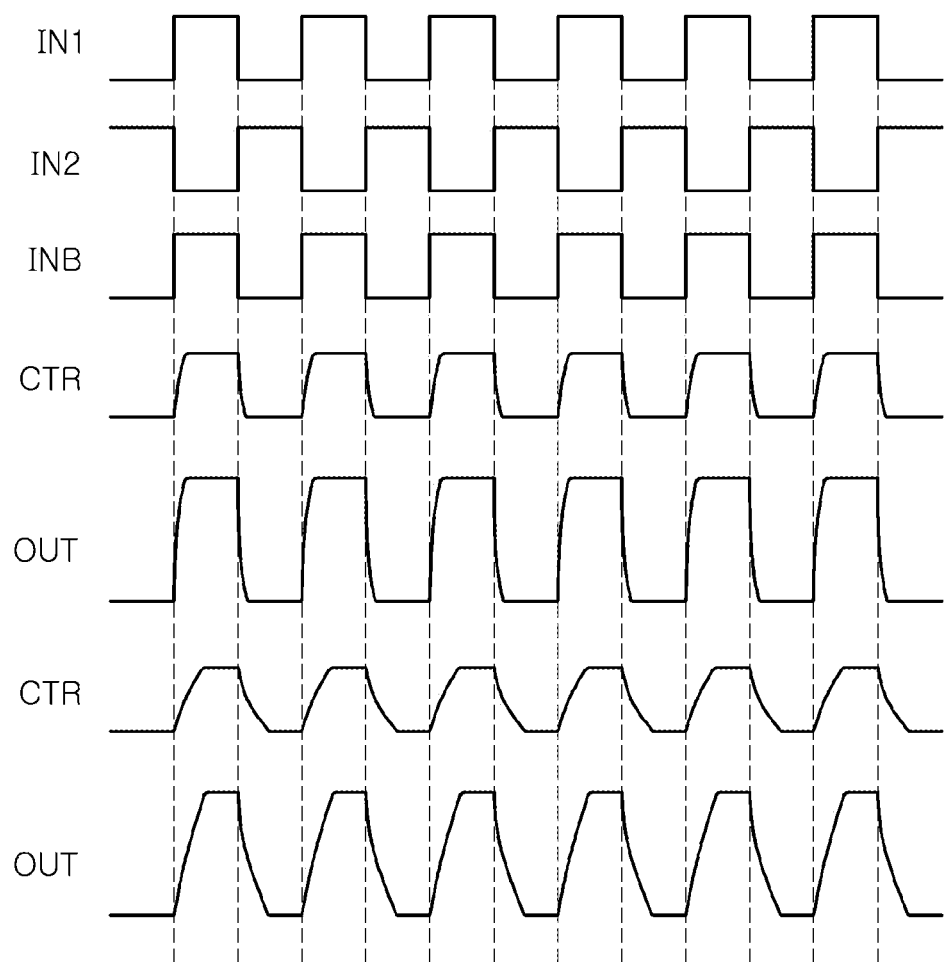
FIGS. 7 and 8 are views illustrating an operation of an interface circuit according to example embodiments.
Figure 8:
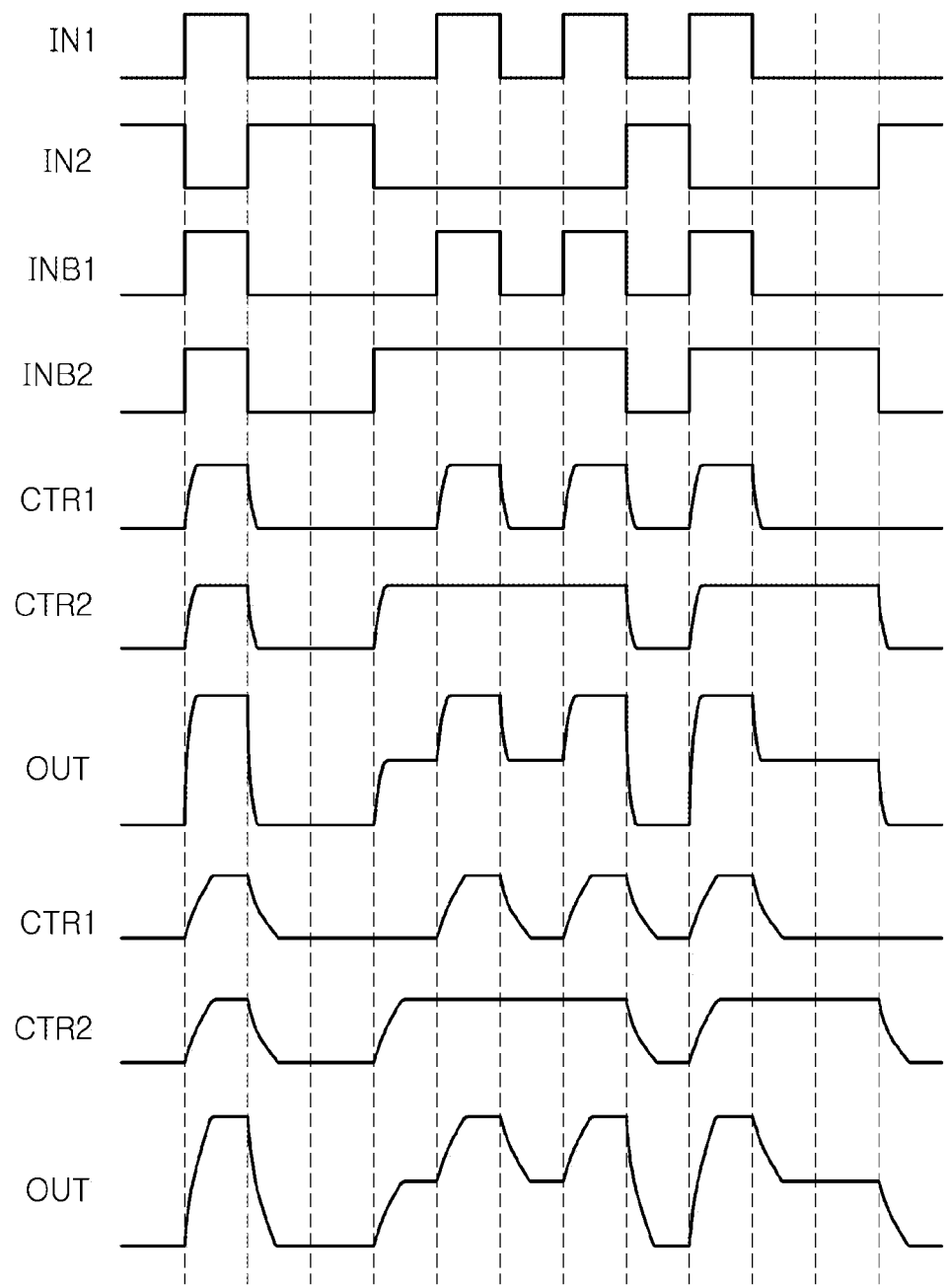

FIGS. 7 and 8 are views illustrating an operation of an interface circuit according to example embodiments.

In example embodiments described with reference to FIG. 7, an interface circuit may operate in a differential signaling scheme. As illustrated in FIG. 7, when a first switch element SW1 is turned on by the first input signal IN1 and a second switch element SW2 is turned off by a second input signal IN2, an output signal OUT may be increased from a low level to a high level. In addition, when the first switch element SW1 is turned off by the first input signal IN1 and the second switch element SW2 is turned on by the second input signal IN2, the output signal OUT may be decreased from a high level to a low level.

A first capacitor C1 and a second capacitor C2 may be charged and discharged by a control signal CTR. As an example, a buffer BUF may receive a buffer input signal INB having the same phase as the first input signal IN1 to output the control signal CTR. When a first switch element SW1 is turned on and a second switch element SW2 is turned off, the first capacitor C1 and the second capacitor C2 may be charged by the control signal CTR. As the first capacitor C1 and the second capacitor C2 are charged, the output signal OUT may be rapidly increased from a low level to a high level. When the first switch element SW1 is turned off and the second switch element SW2 is turned on, the first capacitor C1 and the second capacitor C2 may be discharged, and the output signal OUT may be rapidly decreased from a high level to a low level.

A slew rate of the control signal CTR may vary depending on resistance values of a first variable resistor VR1 and a second variable resistor VR2 connected to the buffer BUF. As an example, when the resistance values of the first variable resistor VR1 and the second variable resistor VR2 are increased, the slew rate of the control signal CTR may be decreased. When the resistances value of the first variable resistor VR1 and the second variable resistor VR2 are decreased, the slew rate of the control signal CTR may be increased.

The slew rate of the output signal OUT may vary depending on a slew rate of the control signal CTR. As an example, when the control signal CTR has a high slew rate, the slew rate of the output signal OUT may also be increased in response to the high slew rate of the control signal CTR. When the control signal CTR has a relatively low slew rate, the slew rate of the output signal OUT may also be decreased. Therefore, as illustrated in FIG. 7, the slew rate of the output signal OUT may be controlled only by adjusting the resistance values of the first variable resistor VR1 and the second variable resistor VR2, connected to the buffer BUF, without controlling the first input signal IN1, the second input signal IN2, and the buffer input signal INB.

In example embodiments described with reference to FIG. 8, an interface circuit may operate in a single-ended signaling scheme. Referring to FIG. 8, when a first switch element SW1 is turned on and a second switch element SW2 is turned off, an output signal OUT may be increased from a low level to a high level. When the first switch element SW1 is turned off and the second switch element SW2 is turned on, the output signal OUT may be decreased from a high level to a low level. In addition, as one of the first switch element SW1 and the second switch element SW2 is turned on or off, the output signal OUT may be increased from a low level to a mid level or may be decreased from a high level to a mid level.

In addition, in example embodiments described with reference to FIG. 8, a first capacitor C1 of an interface circuit may be charged and discharged by a first control signal CTR1, and a second capacitor C2 of the interface circuit may be charged and discharged by a second control signal CTR2. The first control signal CTR1 and the second control signal CTR2 may be different from each other. As an example, the interface circuit may include a first buffer, receiving a first buffer input signal INB1 and outputting the first control signal CTR1 to the first capacitor C1, and a second buffer receiving a second buffer input signal INB2 and outputting a second control signal CTR2 to the second capacitor C2. As an example, the output signal OUT may be determined as illustrated in Table 1.

In example embodiments described with reference to FIGS. 7 and 8, the slew rates of the control signals CTR, CTR1, and CTR2 may be determined according to an operating condition of an interface circuit. For example, when the interface circuit is required to support high-speed data communications, the slew rates of the control signals CTR, CTR1, and CTR2 may be increased. In some example embodiments, the amount of increase in the slew rates of the control signals CTR, CTR1, and CTR2 may vary depending on a load of a data communications channel through which the interface circuit sends the output signal OUT.

As an example, when a load of a data communications channel is relatively low, the amount of increase in the slew rates of the control signals CTR, CTR1, and CTR2 may be relatively small. Even in the case in which the load of the data communications channel is low, overshoot in which the output signal OUT is increased to be larger than an upper limit value may occur when the amount of increase in the slew rates of the control signals CTR, CTR1, and CTR2 is set to be large. In example embodiments, the slew rates of the control signals CTR, CTR1, and CTR2 may be determined in consideration of the load of the data communications channel as well as data communications speed to the

TABLE 1

| Output Signal (OUT) | First input signal (IN1) | Second Input Signal (IN2) | First Capacitor | Second Capacitor |
|---|---|---|---|---|
| Low → High | Low → High | High → Low | Charged | Charged |
| High → Low | High → Low | Low → High | Discharged | Discharged |
| Low → Mid | Low | High → Low | X | Charged |
| Mid → Low | Low | Low → High | X | Discharged |
| Mid → High | Low → High | Low | Charged | X |
| High → Mid | High → Low | Low | Discharged | X |

Referring to both FIG. 8 and Table 1, when the amount of change in the output signal OUT is a first value, only one of the first capacitor C1 and the second capacitor C2 may be charged or discharged. On the other hand, when the amount of change in the output signal OUT is a second value greater than the first value, the first capacitor C1 and the second capacitor C2 may be simultaneously charged or discharged. The first value may be a difference between the high level and the mid level and a difference between the mid level and the low level, and the second value may be a difference between the high level and the low level.

As an example, only the second capacitor C2 may be charged when the output signal OUT is increased from a low level to a mid level and may be discharged when the output signal OUT is decreased from a mid level to a low level. Only the first capacitor C1 may be charged when the output signal OUT is increased from a mid level to a high level and may be discharged when the output signal OUT is decreased from a high level to a mid level. In example embodiments illustrated in Table 1, the first control signal CTR1 may be the same as the first input signal IN1, and the second control signal CTR2 may be a complementary signal of the second input signal IN2.

As illustrated in FIG. 8, a slew rate of each of the first control signal CTR1 and the second control signal CTR2 may be adjusted to change the slew rate of the output signal OUT. As an example, the slew rate of each of the first control signal CTR1 and the second control signal CTR2 may be increased to increase the slew rate of the output signal OUT. In addition, the slew rates of each of the first control signal CTR1 and the second control signal CTR2 may be decreased to slowly change the slew rate of the output signal OUT.

overshoot of the output signal OUT and to improve an eye margin of the output signal OUT. When the load of the data communications channel is high, the amount of increase in the slew rates of the control signals CTR, CTR1, and CTR2 may be set to be relatively large.

Figure 9:
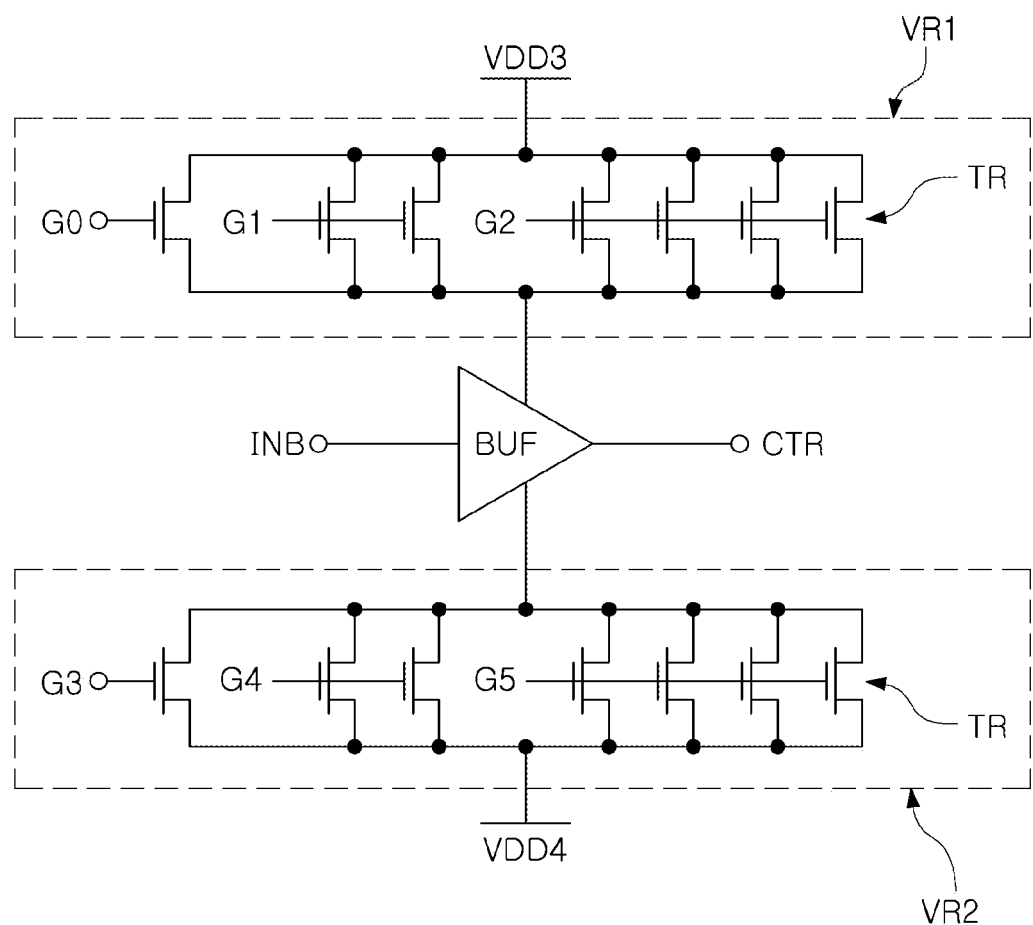
FIGS. 9 and 10 are views illustrating an operation of an interface circuit according to example embodiments.
Figure 10:
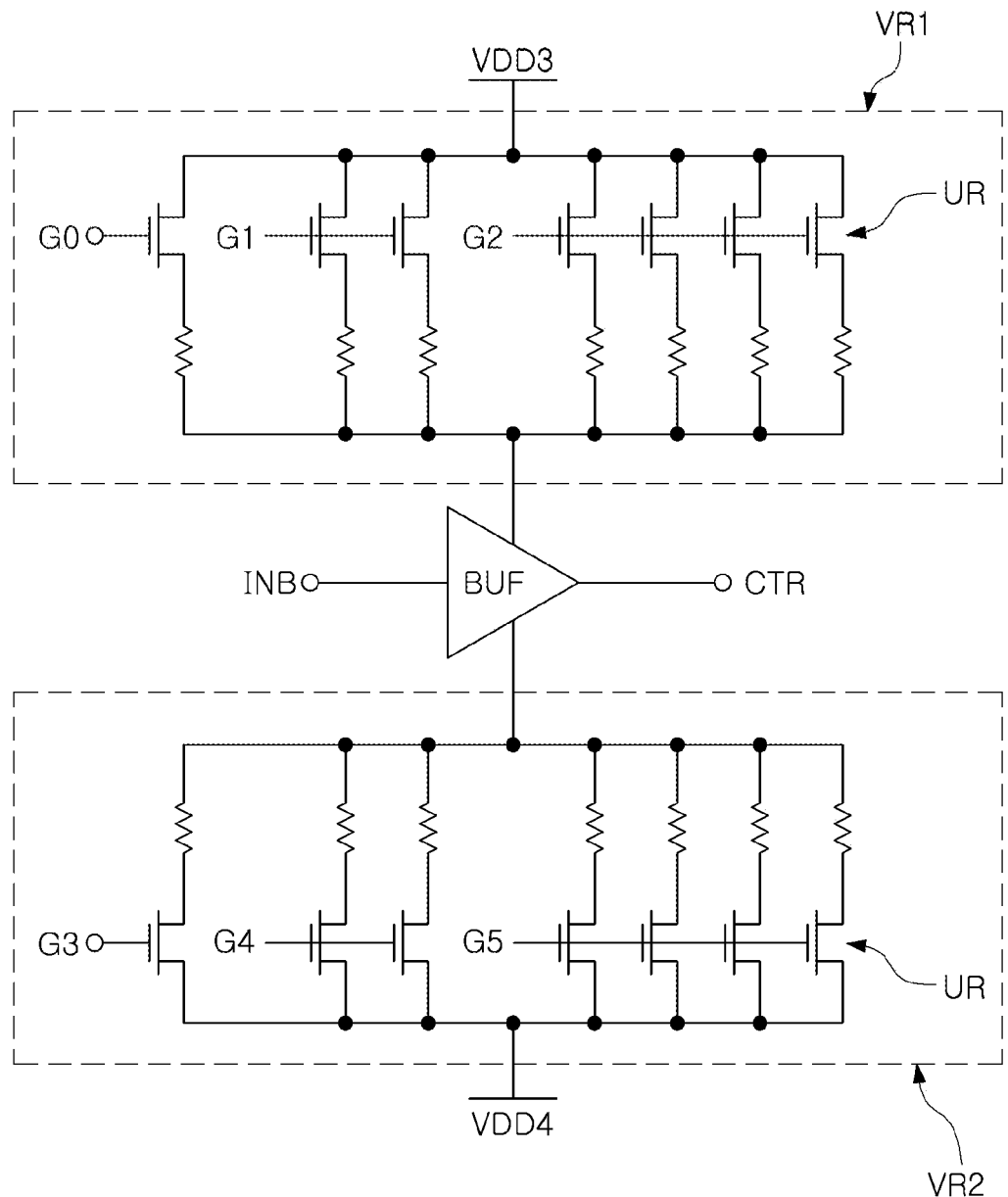

FIGS. 9 and 10 are views (may be variable resistor circuit diagrams) illustrating an operation of an interface circuit according to example embodiments.

FIGS. 9 and 10 may be views illustrating a buffer included in an interface circuit in detail. Referring to FIGS. 9 and 10, a buffer BUF may receive a power supply voltage through a first variable resistor VR1 and a second variable resistor VR2.

Referring to FIG. 9, the first variable resistor VR1 and the second variable resistor VR2 may have the same structure. As an example, each of the first variable resistor VR1 and the second variable resistor VR2 may include a plurality of transistors TR connected to each other in parallel. Each of the plurality of transistors TR may have predetermined or alternatively, desired ON-resistance in a turned-on state. Based on this, the variable resistors VR1 and VR2 may be implemented. As an example, the ON-resistances of the plurality of transistors TR may be the same.

Hereinafter, the first variable resistor VR1 will be described as an example. In FIG. 9, the first variable resistor VR1 is illustrated as including seven transistors TR. However, the number of transistors TR is not limited thereto. Some of the transistors TR may be simultaneously turned on and turned off by a single gate signal. Referring to FIG. 9, two transistors TR may commonly receive a single gate signal G1, and four transistors TR may commonly receive a single gate signal G2.

Gate signals G0, G1, and G2 may be input to an interface circuit in the form of a single digital signal. As an example, under the assumption that the gate signals G0, G1, and G2 are a least significant bit (LSB) to a most significant bit (MSB) in order, a resistance value of the first variable resistor VR1 may be determined using a digital signal having three bits. As an example, when the digital signal is [001], only one transistor TR may be turned on, so that the first variable resistor VR1 may have a largest resistance value. When the digital signal is [111], all of the transistors TR may be turned on, so that the first variable resistor VR1 may have a smallest resistance value. Similarly, a resistance value of the second variable resistor VR2 may be determined using a single digital signal corresponding to gate signals G3, G4, and G5 input to the second variable resistor VR2.

Referring to FIG. 10, each of the first variable resistor VR1 and the second variable resistor VR2 may include a plurality of transistors TR and a plurality of unit resistors UR connected to each other in parallel. For example, ON-resistances of the plurality of transistors TR may be the same, and resistance values of the plurality of unit resistors UR may also be the same.

Hereinafter, the first variable resistor VR1 will be described as an example. In FIG. 10, the first variable resistor VR1 is illustrated as including seven transistors TR. However, the number of transistors TR is not limited thereto. Similarly to what was described with reference to FIG. 9, some of the transistors TR may be simultaneously turned on and turned off by a single gate signal.

In example embodiments illustrated in FIG. 10, a resistance value of the first variable resistor VR1 may be determined by unit resistances UR. For example, when a digital signal input to the first variable resistor VR1 is [001], the resistance value of the first variable resistor VR1 may be the same as a resistance value of a single unit resistor UR. When the digital signal is [010], the resistance value of the first variable resistor VR1 may be the same as a combined resistance value of two unit resistors UR. Similarly, a resistance value of the second variable resistor VR2 may be determined using a single digital signal corresponding to gate signals G3, G4, and G5 input to the second variable resistor VR2.

Figure 11:
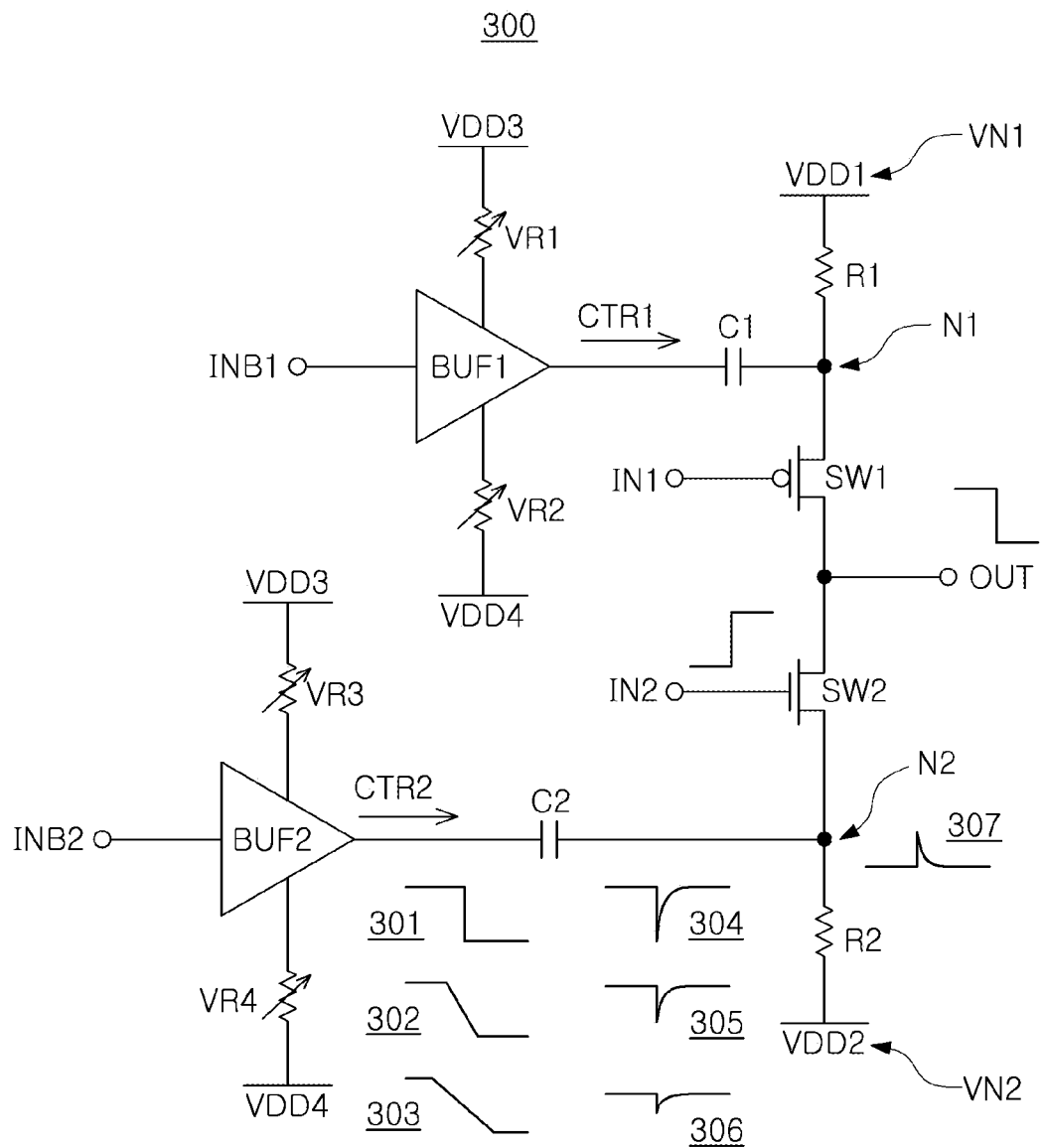
FIG. 11 is a schematic circuit diagram illustrating an interface circuit according to example embodiments.

FIG. 11 is a schematic circuit diagram illustrating an interface circuit according to example embodiments.

Referring to FIG. 11, an interface circuit 300 according to example embodiments may include a first switch element SW1 and a second switch element SW2, a first capacitor C1, a second capacitor C2, a first resistor R1, a second resistor R2, and/or the like. In example embodiments illustrated in FIG. 11, the first switch element SW1 may be implemented as a PMOS transistor, and the second switch element SW2 may be implemented as an NMOS transistor. Therefore, a phase of a first input signal IN1 may be same with a phase of a second input signal IN2.

As an example, the interface circuit 300 according to example embodiments illustrated in FIG. 11 may be applied to an interface requiring a larger voltage swing. As an example, the interface circuit 300 may be applied to an interface such as PCI-Express, USB, or the like.

In example embodiments illustrated in FIG. 11, the interface circuit 300 may include a first buffer BUF1 and a second buffer BUF1. The first buffer BUF1 and the second buffer BUF2 may receive a third power supply voltage VDD3 and a fourth power supply voltage VDD4 through variable resistors VR1 to VR4, respectively. The first buffer BUF1 may output a first control signal CTR1 in response to a first buffer input signal INB1, and a first capacitor C1 may be charged and discharged by the first control signal CTR1. Similarly, a second capacitor C2 may be charged and discharged by a second control signal CTR2 output from the second buffer BUF2.

Except that the first switch element SW1 is implemented as a PMOS transistor, the contents described with reference to FIG. 6 may be similarly applied to example embodiments illustrated in FIG. 11. As an example, slew rates of the control signals CTR1 and CTR2 may be adjusted to change a slew rate of an output signal OUT. The slew rates of the control signals CTR1 and CTR2 may be determined by resistance values of the variable resistors VR1 to VR4. In addition, when the interface circuit 200 described with reference to FIG. 6 operates in a single-ended signaling scheme, the first capacitor C1 and second capacitor C2 may be connected to the first buffer BUF1 and the second buffer BUF2, respectively, to be charged and discharged independently of each other.

Referring to FIG. 11, when the second input signal IN2 is increased to turn on the second switch element SW2, the output signal OUT may be decreased from a high level to a low level. When the first input signal IN1 and the second input signal IN2 are the same, the first switch element SW1 may be turned off. In some example embodiments, a voltage 307 on a second node N2 may be momentarily increased due to charge sharing, as illustrated in FIG. 11. Since the voltage 307 on the second node N2 is increased when the output signal OUT is decreased from the high level to the low level, the slew rate of the output signal OUT may be low.

In some example embodiments, a decrease in the slew rate of the output signal OUT may be significantly reduced using the second capacitor C2 connected to the second node N2. Referring to FIG. 11, a second control signal CTR2, output to the second capacitor C2 by the second buffer BUF2, may be decreased from a high level to a low level. As the second control signal CTR2 is decreased from the high level to the low level, an increase in the voltage 307 on the second node N2, caused by charge sharing, may be cancelled and a decrease in the slew rate of the output signal OUT may be significantly reduced.

A voltage fluctuation, occurring in the first node N1 and/or the second node N2 due to charge sharing while the interface circuit 300 operates, may vary depending on a load of a channel through which the output signal OUT is output, or the like. As an example, when the load of the channel is high, a voltage fluctuation occurring in the first node N1 and/or the second node N2 may be large. In some example embodiments, a slew rate of the second control signal CTR2 may be differently selected in consideration of the load of the channel to appropriately cancel a voltage fluctuation occurring in the first node N1 and/or the second node N2.

Referring to FIG. 11, the second control signal CTR2 may have one waveform, among first to third waveforms 301 to 303. It will be understood that the first waveform 301 has a highest slew rate, and the third waveform 303 has the lowest slew rate. When the second control signal CTR2 having one of the first to third waveforms 301 to 303 is output, a charge sharing effect may arise in the second node N2 in the form of one waveform, among fourth to sixth waveforms 304 to 306, due to the second capacitor C2. As an example, the fourth waveform 304 may correspond to a charge sharing effect arising due to the second control signal CTR2 having the first waveform 301, and the sixth waveform 306 may correspond to a charge sharing effect arising due to the control signal CTR2 having the third waveform 303.

The voltage fluctuation in the second node N2 may be determined by a charge sharing effect, arising due to a switching operation of the second switch element SW2, and a charge sharing effect arising due to the second capacitor C2. As an example, in example embodiments illustrated in FIG. 11, the second control signal CTR2 may be controlled to have the second waveform 302, and thus, a charge sharing effect arising due to switching of the second switch element SW2 may be cancelled with the charge sharing effect arising due to the second capacitor C2. As a result, an eye margin of the output signal OUT may be significantly and/or reliably secured and the slew rate of the output signal OUT may be improved.

Figure 12:
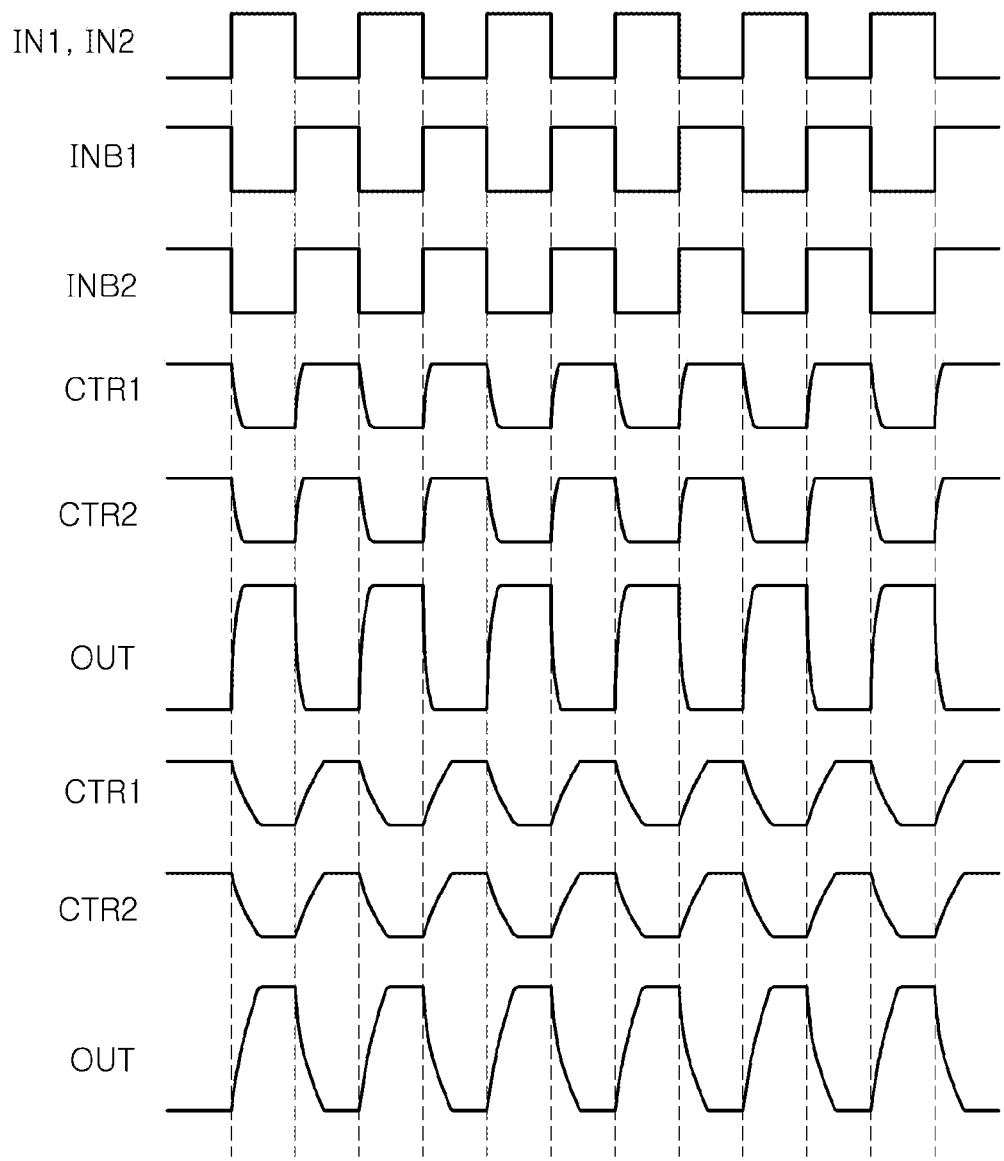
FIGS. 12 and 13 are views illustrating an operation of an interface circuit according to example embodiments.
Figure 13:
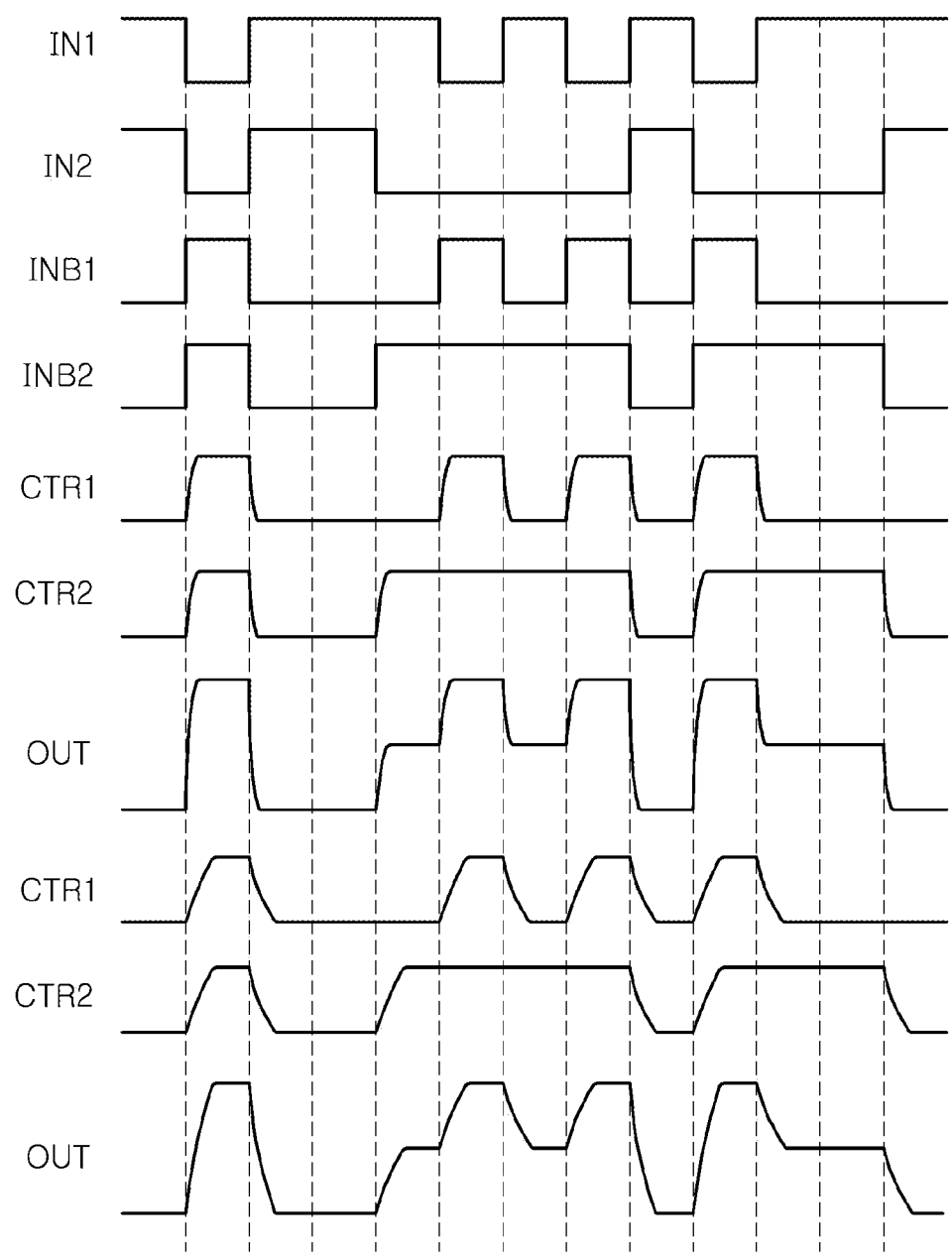

FIGS. 12 and 13 are views illustrating an operation of an interface circuit according to example embodiments.

FIG. 12 may be a view illustrating example embodiments in which an interface circuit 300 operates in a differential signaling scheme. Since a first switch element SW1 is implemented as a PMOS transistor and a second switch element SW2 is implemented as an NMOS transistor, a phase of a first input signal IN1 may be same with a phase of a second input signal IN2. As an example, a single input signal may be commonly input to the first switch element SW1 and the second switch element SW2. When the first switch element SW1 is turned on and the second switch element SW2 is turned off, an output signal OUT is increased from a low level to a high level. When the first switch element SW1 is turned off and the second switch element SW2 is turned on, the output signal OUT may be decreased from a high level to a low level.

A first capacitor C1 and a second capacitor C2 may be charged when the first switch element SW1 is turned on and the second switch element SW2 is turned off, and may be discharged when the first switch element SW1 is turned off and the second switch element SW2 is turned on. Therefore, the first buffer input signal INB1 and the second buffer input signal INB2 may have a phase opposite to a phase of the first input signal IN1 and the second input signal IN2. Control signals CTR1 and CTR2 may be increased when the first switch element SW1 is turned on and the second switch element SW2 is turned off, and may be decreased when the first switch element SW1 is turned off and the second switch element SW2 is turned off.

Referring to FIG. 12, a slew rate of the output signal OUT may be determined by slew rates of the control signals CTR1 and CTR2. When the slew rates of the control signals CTR1 and CTR2 are decreased, the slew rate of the output signal OUT may be decreased. When the slew rates of the control signals CTR1 and CTR2 are increased, the slew rate of the output signal OUT may be increased. As described above, the slew rates of the control signals CTR1 and CTR2 may vary depending on resistance values of the variable resistors VR1 to VR4 connected to buffers BUF1 and BUF2. Accordingly, the slew rate of the output signal OUT may be determined as a desired value by adjusting the resistance values of the variable resistors VR1 to VR4.

FIG. 13 may be a view illustrating example embodiments in which an interface circuit 300 operates in a single-ended signaling scheme. When an interface circuit operates in a single-ended signaling scheme, unlike example embodiments described with reference to FIG. 12, a first buffer input signal INB1 and a second buffer input signal INB2 may be different from each other. Thus, charging and discharging of each of the first capacitor C1 and the second capacitor C2 may be independently controlled.

A first input signal IN1, a second input signal IN2, a first control signal CTR1, a second control signal CTR2, and an output signal OUT may be determined as described with reference to Table 1. As an example, when the first input signal IN1 is increased and the second input signal IN2 is decreased, the output signal OUT may be increased from a low level to a high level. In some example embodiments, a first capacitor C1 and a second capacitor C2 may be charged, and a slew rate of the output signal OUT may be determined according to slew rates of the first control signal CTR1 and the second control signal CTR2 charging the first capacitor C1 and the second capacitor C2.

Referring to FIG. 13, as the slew rates of the first control signal CTR1 and the second control signal CTR2 are increased, the slew rate of the output signal OUT may also be increased. As the slew rates of the first control signal CTR1 and the second control signal CTR2 are decreased, the slew rate of the output signal OUT may also be decreased. Resistance values of the variable resistors VR1 to VR4, supplying power supply voltages to each of the first buffer BUF1 and the second buffer BUF2, may be changed to adjust the slew rates of the first control signal CTR1 and the second control signal CTR2 and the slew rate of the output signal OUT.

Figure 14:
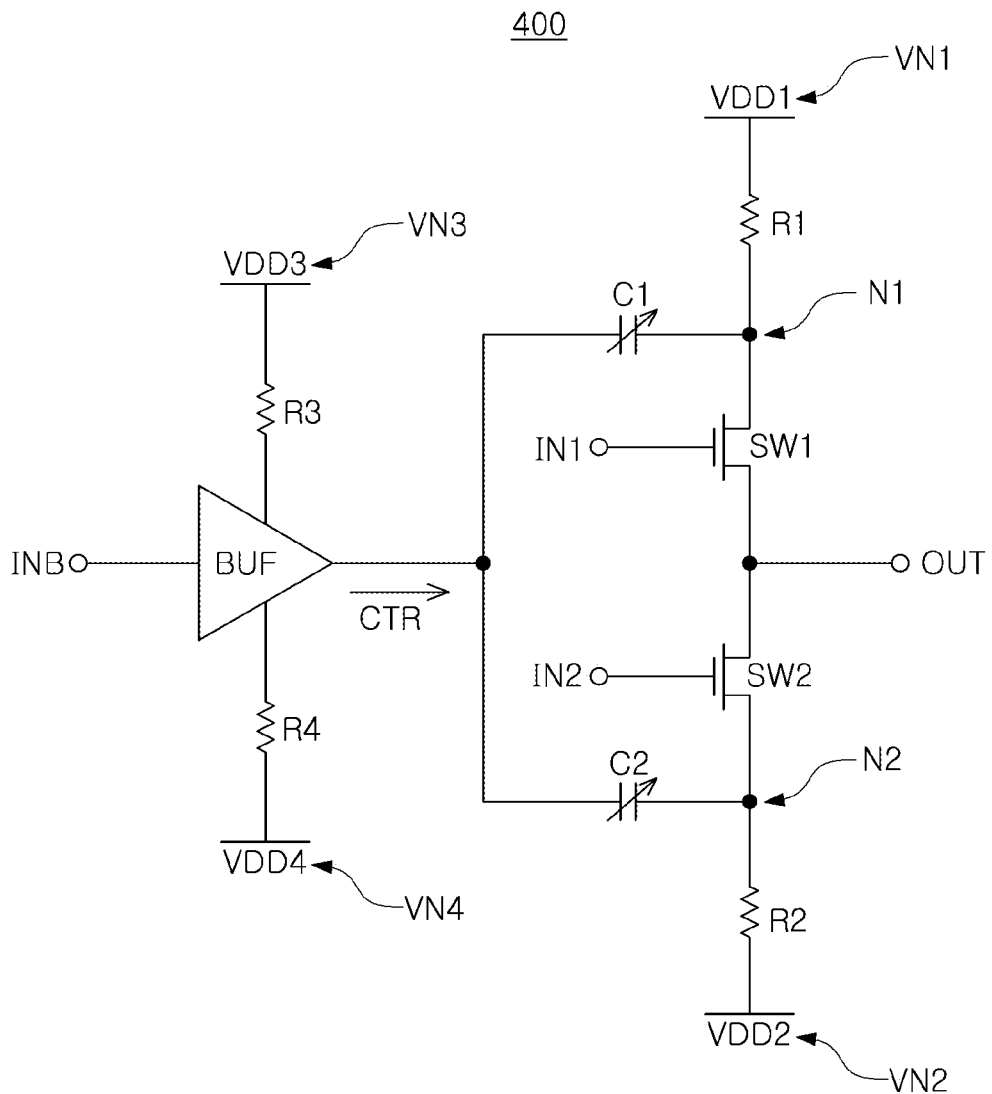
FIG. 14 is a schematic circuit diagram of an interface circuit according to example embodiments.

FIG. 14 is a schematic circuit diagram of an interface circuit according to example embodiments.

Referring to FIG. 14, an interface circuit 400 according to example embodiments may include a first switch element SW1 and a second switch element SW2, a first capacitor C1, a second capacitor C2, a first resistor R1, a second resistor R2, and/or the like. Except that each of the first capacitor C1 and the second capacitor C2 is a variable capacitor, the other components and features may be similar to those in example embodiments described with reference to FIG. 6. As an example, charging and discharging of the first capacitor C1 and the second capacitor may be controlled by a control signal CTR. The control signal CTR may be an output signal of a buffer BUF, and the buffer BUF may receive a buffer input signal INB to output the control signal CTR.

In example embodiments illustrated in FIG. 14, the first capacitor C1 and the second capacitor C2 may have variable capacitances. As an example, the capacitances of the first capacitor C1 and the second capacitor C2 may be set to be large in a communication environment in which the slew rate of the output signal OUT needs to be significantly increased, and may be set to be small in a communication environment in which the slew rate of the output signal OUT does not need to be significantly increased.

In some example embodiments, the first capacitor C1 and the second capacitor C2 may include a plurality of unit capacitors connected to each other in parallel such that each of the first capacitor C1 and the second capacitor C2 is implemented as a variable capacitor. In addition, the plurality of unit capacitors may be connected to different buffers such that charging and discharging of each of the plurality of unit capacitors are effectively performed. Hereinafter, this will be described in more detail with reference to FIGS. 15 and 16.

Figure 15:
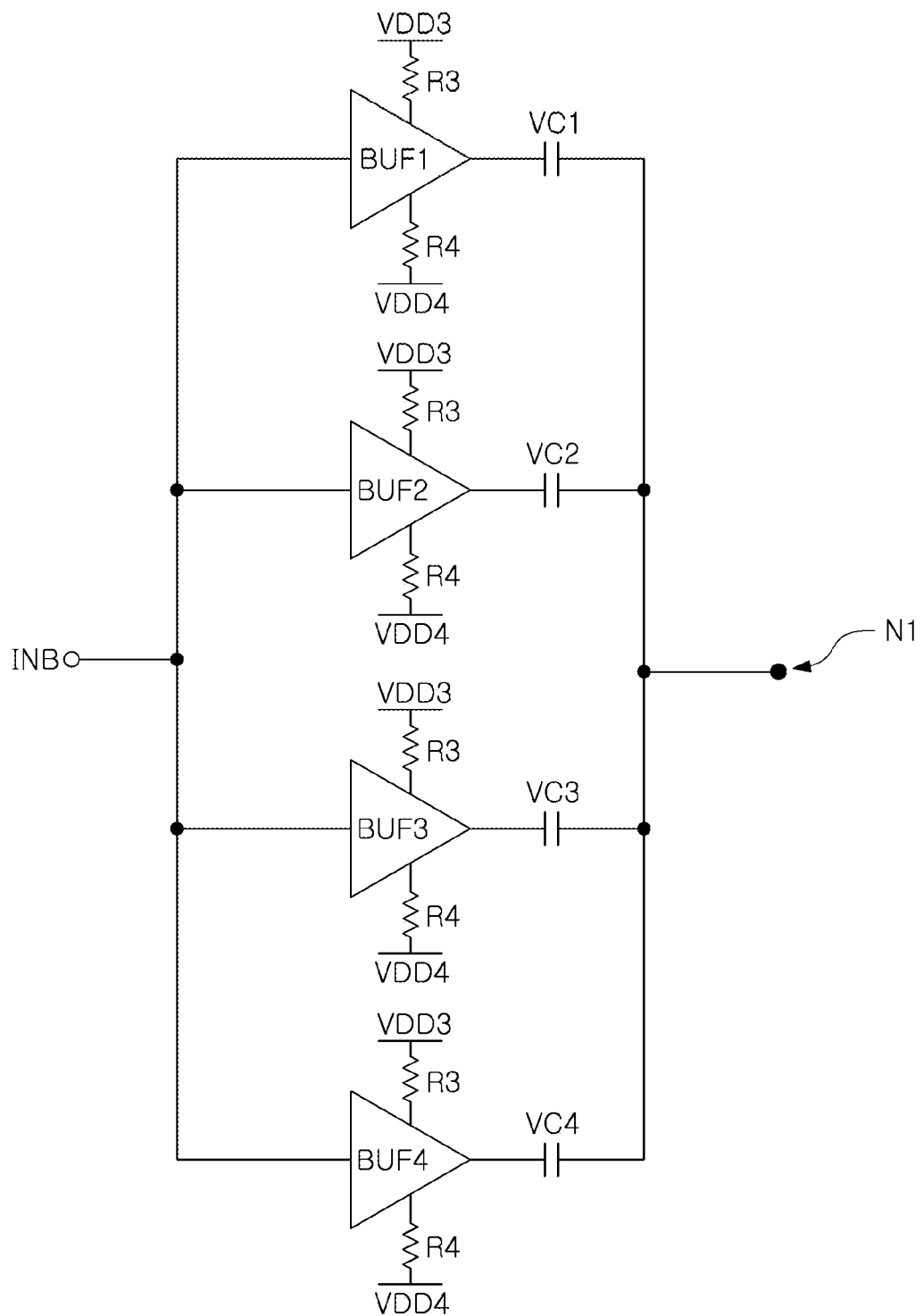
FIGS. 15 and 16 are views illustrating an operation of an interface circuit according to example embodiments.
Figure 16:
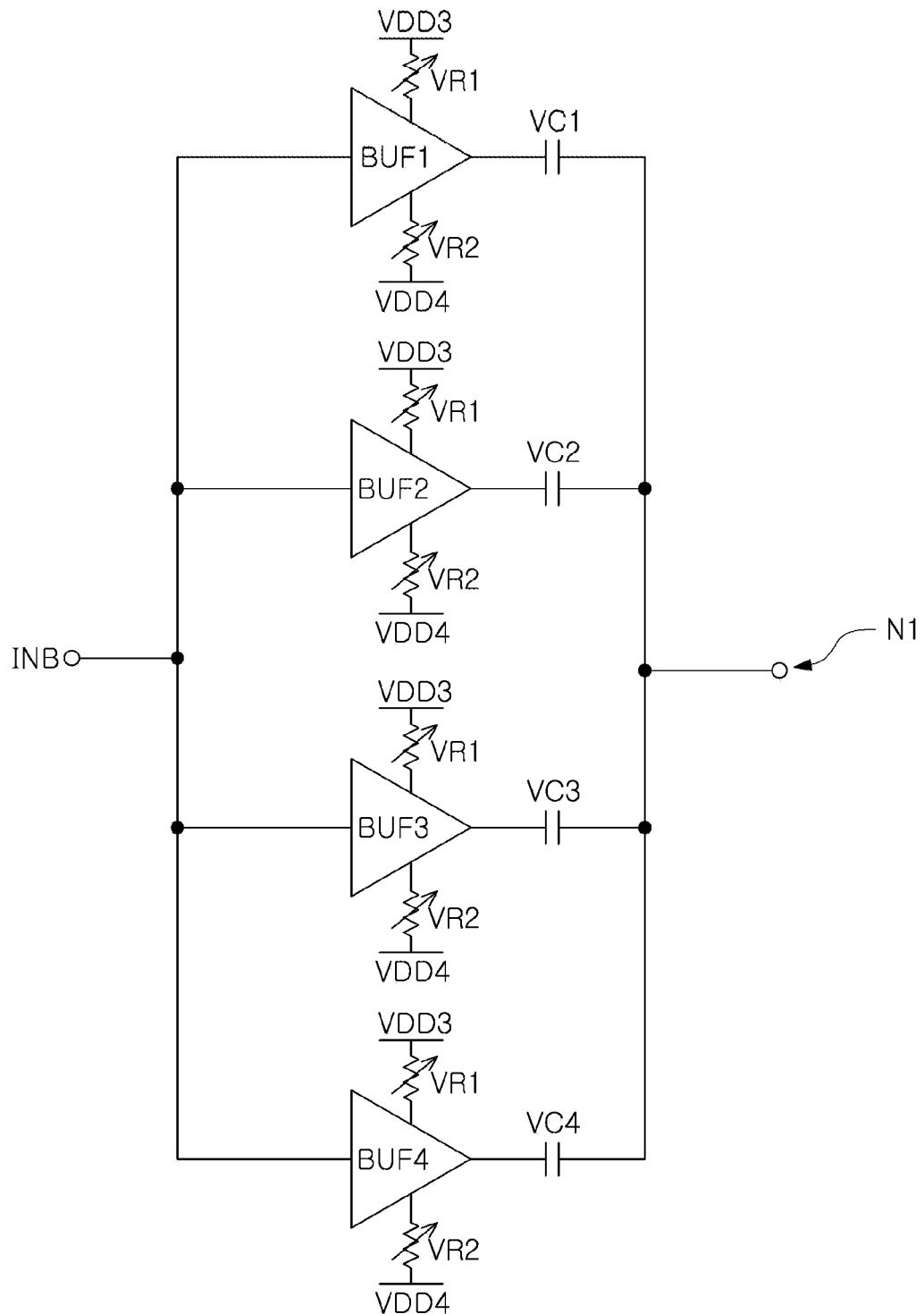

FIGS. 15 and 16 are views illustrating an operation of an interface circuit according to example embodiments.

FIGS. 15 and 16 may be views illustrating an example for implementing a first capacitor C1 and a buffer BUF included in an interface circuit 400. Referring to FIGS. 15 and 16, a plurality of buffers BUF1 to BUF4, receiving a buffer input signal INB, and a plurality of unit capacitors VC1 to VC4 may be included in an interface circuit. One end of the plurality of unit capacitors VC1 to VC4 may be connected to a first node N1 between the first resistor R1 and the first switch element SW1.

As an example, the number of buffers BUF1 to BUF4, charging and discharging the unit capacitors VC1 to VC4, may be selected to vary the capacitance of the first capacitor C1 included in the interface circuit 400. As an example, when only the first buffer BUF1 operates, the capacitance of the first capacitor C1 may be determined as capacitance of the first unit capacitor VC1. On the other hand, when all of the buffers BUF1 to BUF4 operate, the capacitance of the first capacitor C1 may be determined as the sum of capacitances of the first to fourth unit capacitors VC1 to VC4. In consideration of a load of a channel through which the output signal OUT of the interface circuit 400 is output, a determination may be made as to whether each of the buffers BUF1 to BUF4 operates, and the capacitance of the first capacitor C1 may be changed, so that the interface circuit 400 may be controlled to generate an output signal OUT having an improved or optimized slew rate.

Referring to FIG. 16, resistors connected to each of the buffers BUF1 to BUF4 may be implemented as variable resistors VR1 and VR2. Therefore, the capacitance of the first capacitor C1 may be determined depending on whether each of the buffers BUF1 to BUF4 operates. A slew rate of the output signal OUT may be more precisely adjusted by changing resistance values of variable resistors VR1 and VR2, connected to the buffers BUF1 to BUF4, from the determined capacitance of the first capacitance. In some example embodiments, the slew rate of the output signal OUT may be set to a desired value by controlling only the first buffer BUF1 to operate and adjusting the resistance values of the variable resistors VR1 and VR2 connected to the first buffer BUF1.

In addition, as an example, two or more buffers BUF1 to BUF4 may be controlled such that two or more buffers BUF1 to BUF4 operate and the variable resistors VR1 and VR2 have different resistance values in some of the two or more buffers BUF1 to BUF4. As an example, when the first buffer BUF1 and the second buffer BUF2 operate, variable resistors VR1 and VR2 connected to the first buffer BUF1 may have resistance values different from those of variable resistors VR1 and VR2 connected to the second buffer BUF2.

Figure 17:
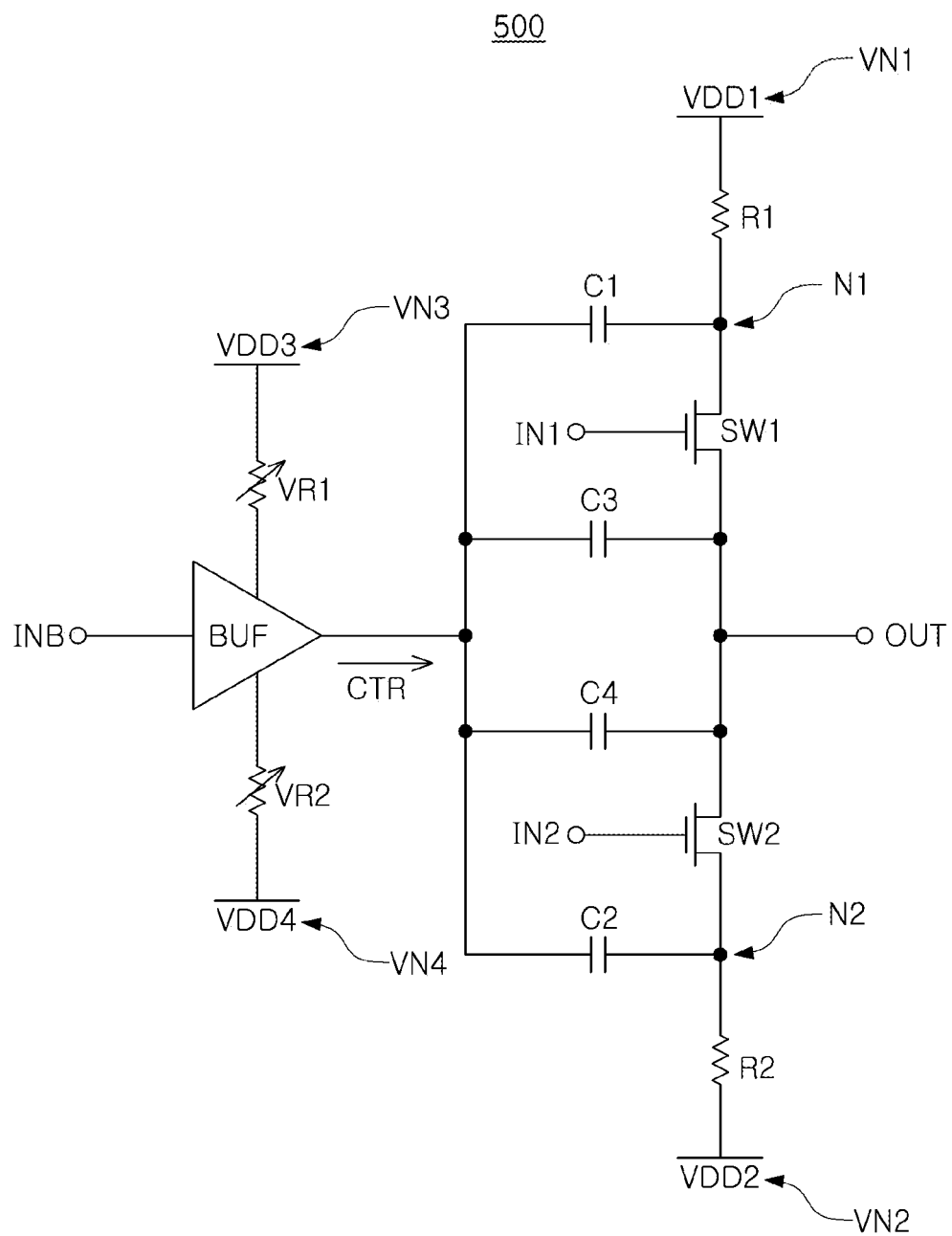
FIGS. 17 to 19 are schematic circuit diagrams illustrating an interface circuits according to example embodiments.
Figure 18:
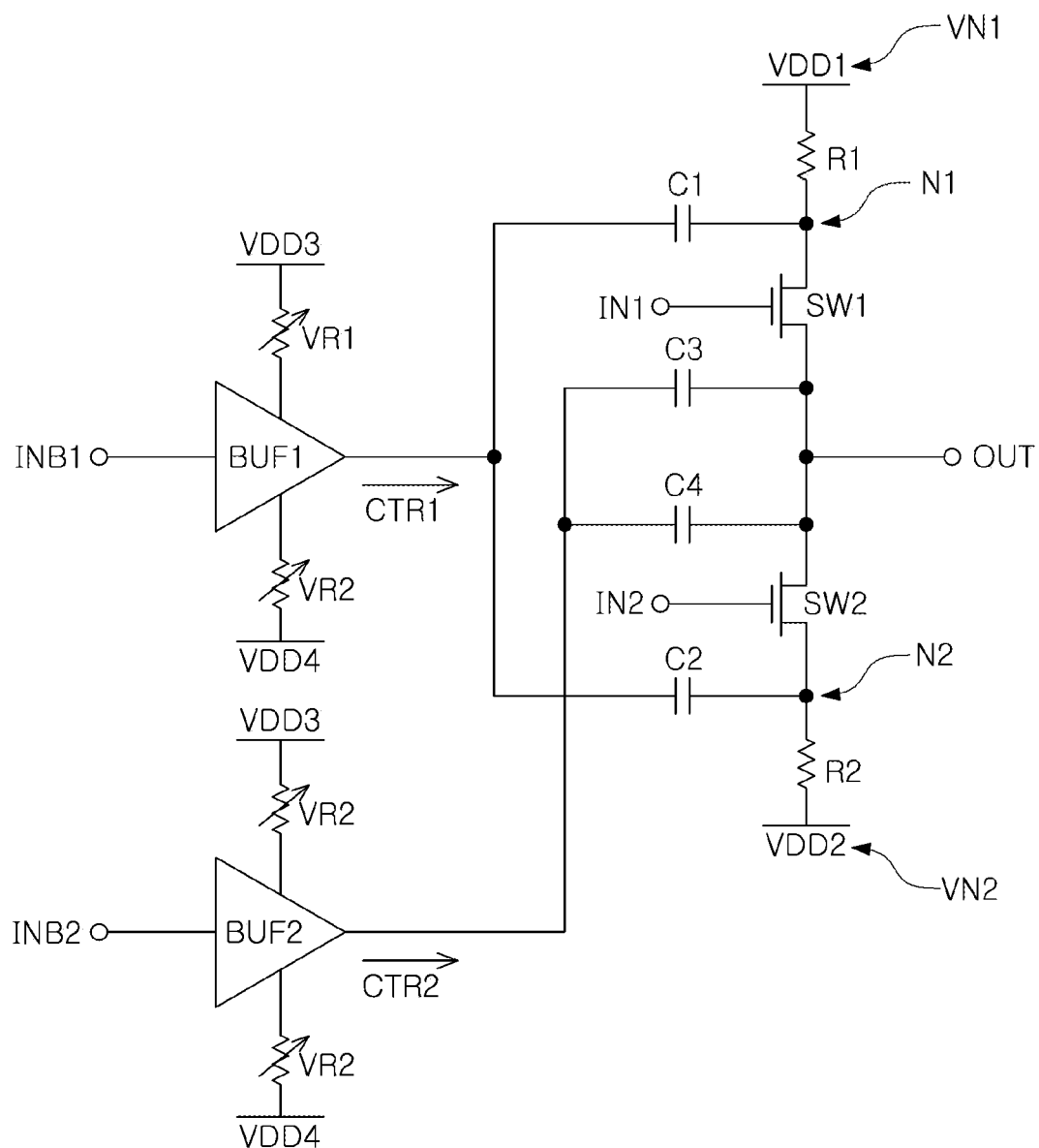
Figure 19:
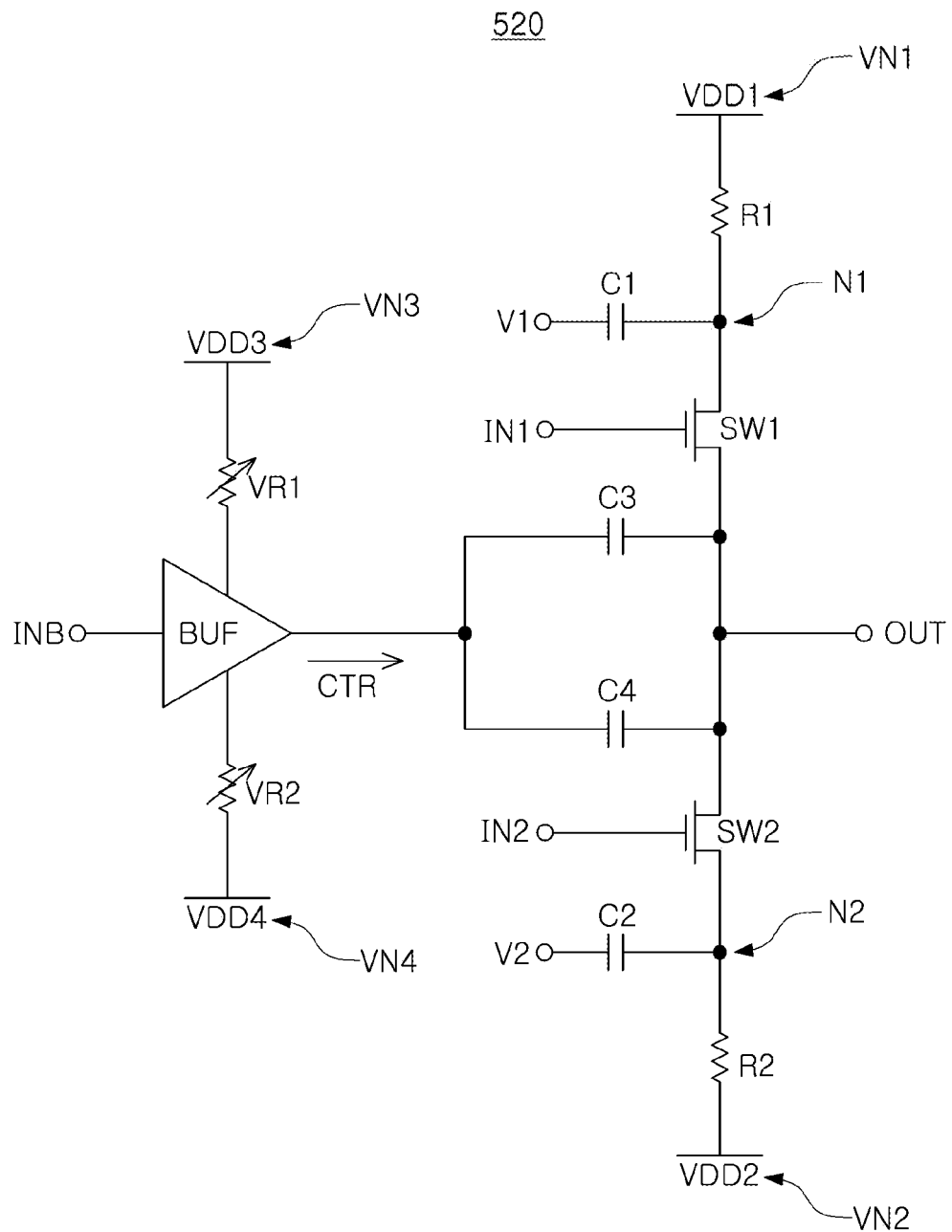

FIGS. 17 to 19 are schematic circuit diagrams illustrating an interface circuits according to example embodiments.

In example embodiments illustrated in FIGS. 17 to 19, interface circuits 500 to 520 may be provided. Each of the interface circuits 500 to 520 may further include a third capacitor C3 and a fourth capacitor C4, connected to an output node, besides a first capacitor C1 and a second capacitor C2. Capacitances of each of the third capacitor C3 and the fourth capacitor C4 may be the same as or different from capacitances of each of the first capacitor C1 and the second capacitor C2. Even in example embodiments illustrated in FIGS. 17 to 19, a slew rate of an output signal OUT output from each of the interface circuits 500 to 520 may vary depending on slew rates of control signals CTR, CTR1, and CTR2 charging and discharging the capacitors C1 to C4.

Referring to FIG. 17, the first to fourth capacitors C1 to C4 may be charged and discharged by the control signal CTR output from a buffer BUF. With reference to the above-described example embodiments, it will be understood whether the first to fourth capacitors C1 to C4 are charged and discharged. For example, in the case in which the interface circuit 500 operates in a differential signaling scheme, the first to fourth capacitors C1 to C4 may be charged by the control signal CTR when the first switch element SW1 is turned on and the second switch element SW2 is turned off. On the other hand, in the case in which the interface circuit 500 operates in a single-ended signaling scheme, the first capacitor C1 and the third capacitor C3 may be connected to one buffer, and the second capacitor C2 and the fourth capacitor C4 may be connected to another buffer.

Alternatively, at least some of the first to fourth capacitors C1 to C4 may be connected to different buffers to reduce a load of the buffer, irrespective of the operation scheme. Referring to FIG. 18, the first capacitor C1 and the second capacitor C2 may be connected to the first buffer BUF1, and the third capacitor C3 and the fourth capacitor C4 may be connected to the second buffer BUF2. Referring to FIG. 19, the first capacitor C1 and the second capacitor C2 may receive a first constant voltage V1 and a second constant voltage V2, respectively, and only the third capacitor C3 and the fourth capacitor C4 may be charged and discharged by the buffer BUF.

Figure 20:
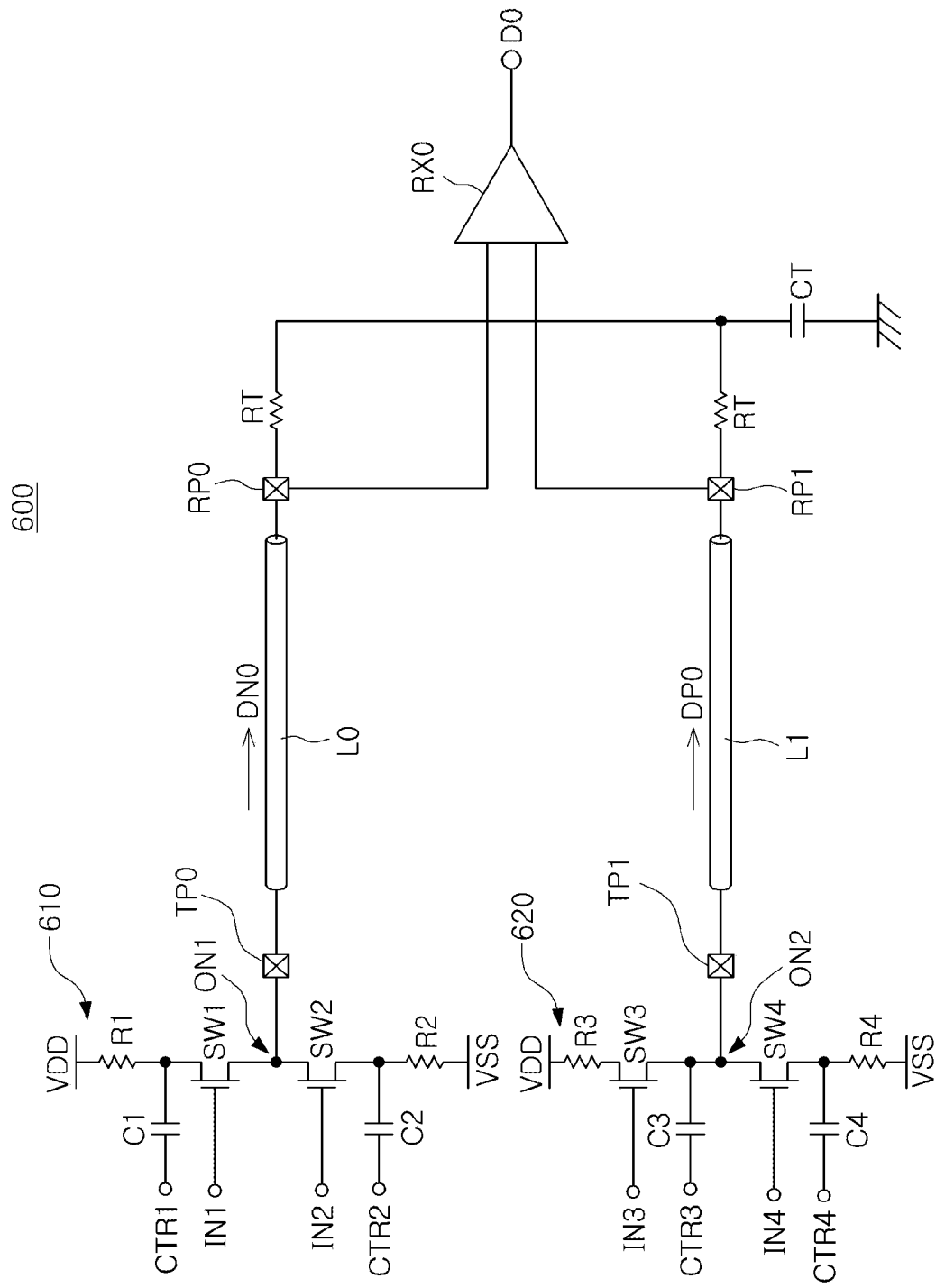
FIG. 20 is a schematic diagram of an interface device according to example embodiments.
Figure 21:
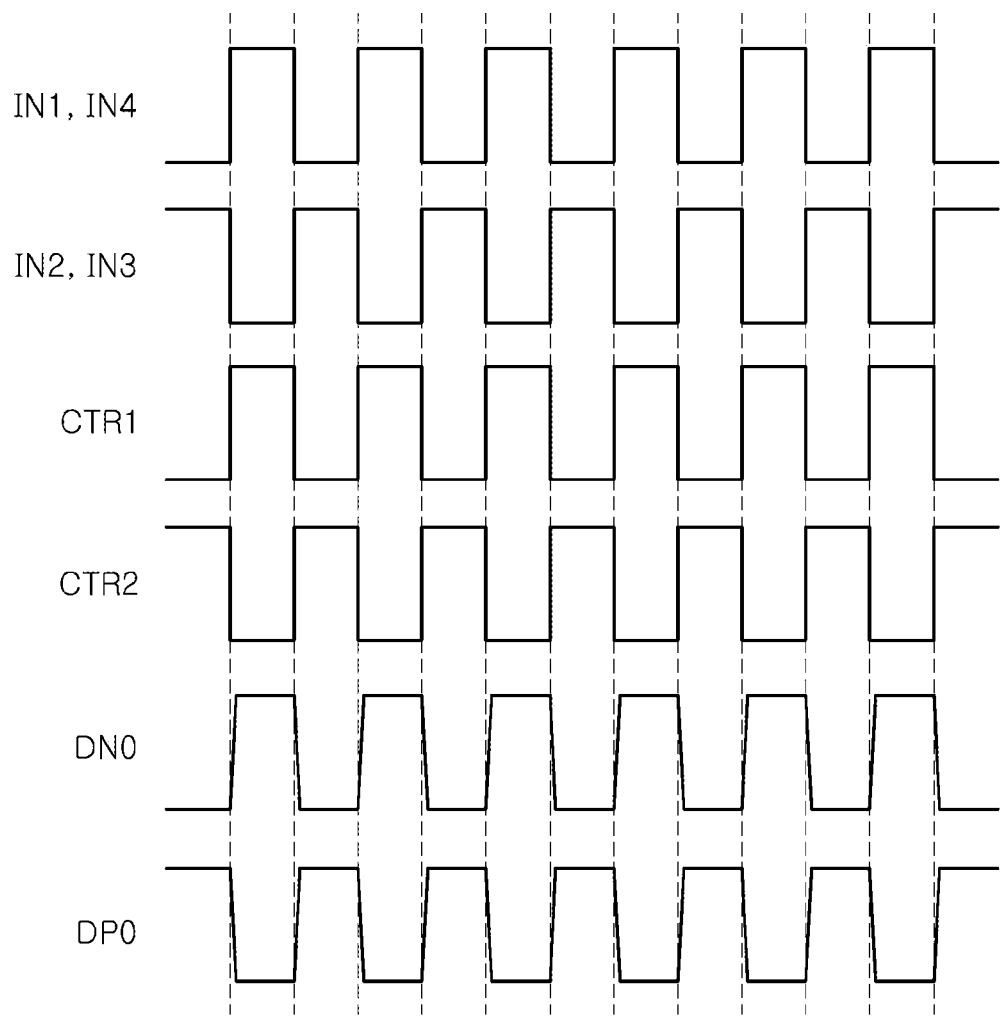
FIGS. 21 and 22 are views illustrating an operation of an interface device according to example embodiments.
Figure 22:
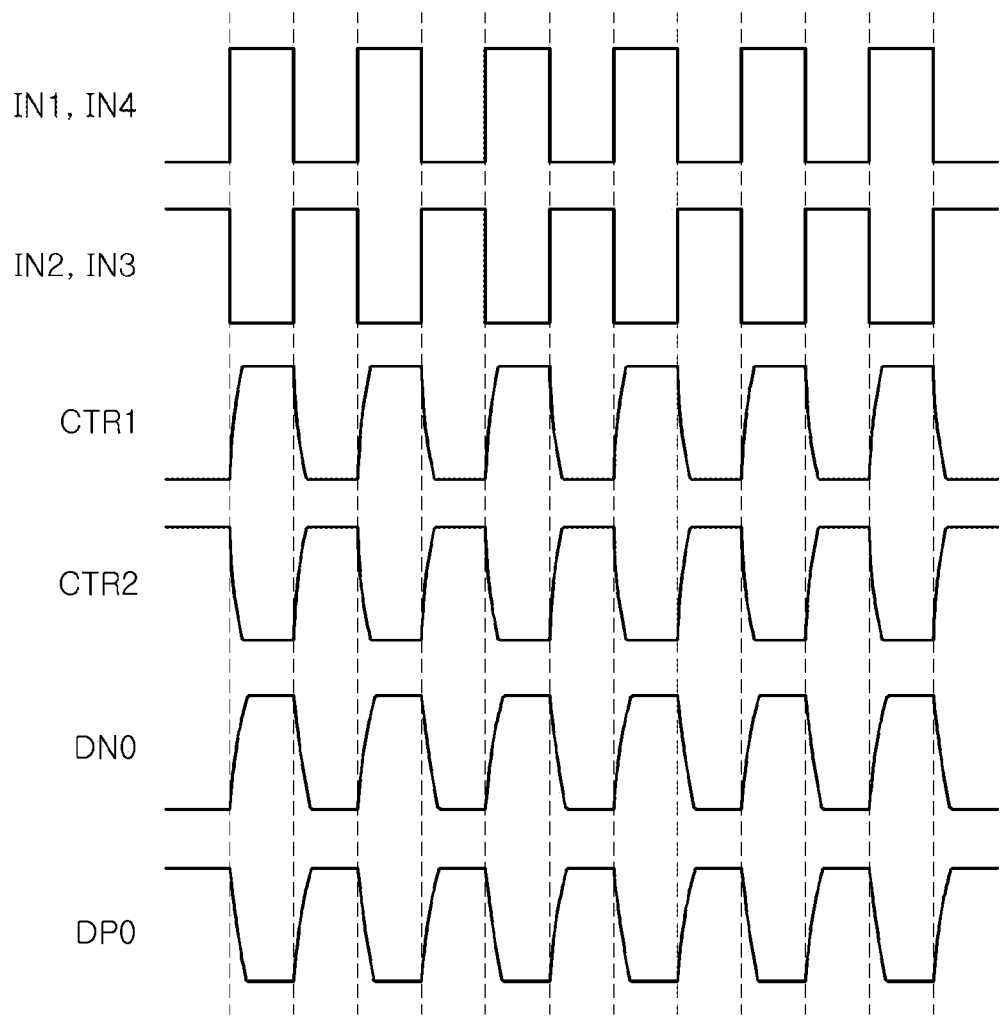

FIG. 20 is a schematic diagram of an interface device according to example embodiments. FIGS. 21 and 22 are views illustrating an operation of an interface device according to example embodiments.

Referring to FIG. 20, an interface device 600 according to example embodiments may operate in a differential signaling scheme. The interface device 600 may include a first interface circuit 610, outputting a first output signal DN0, and a second interface circuit 620 outputting a second output signal DP0. A phase of the first output signal DN0 may be opposite to a phase of the second output signal DP0, and may be transmitted to reception pads RP0 and RP1 from output pads TP0 and TP1 through a first data lane L0 and a second data lane L1. A termination circuit, including a termination resistor RT and a termination capacitor CT, may be connected to each of the first reception pad RP0 and the second reception pad RP1. A receiver RX0 may generate the received data D0 using the first output signal DN0 and the second output signal DP0.

The first interface circuit 610 and the second interface circuit 620 may have the same structure. Now, the first interface circuit 610 will be described as an example. The first interface circuit 610 may include a first switch element SW1 and a second switch element SW2, a first resistor R1, and a second resistor R2, a first capacitor C1, a second capacitor C2, and/or the like. An operation of each of the first switch element SW1 and the second switch element SW2 may be controlled by a first input signal IN1 and a second input signal IN2, and a first output signal DN0 may be output through an output node ON1 and an output pad TP0. Each of the first capacitor C1 and the second capacitor C2 may be charged and discharged by a first control signal CTR1. According to example embodiments, the first capacitor C1 and the second capacitor C2 may be charged and discharged by additional control signals.

In some example embodiments, slew rates of the first control signal CTR1 and the second control signal CTR2, input to the capacitors C1 to C4, may be adjusted to change slew rates of the first output signal DN0 and the second output signal DP0. Hereinafter, the operation of the interface device 600 will be described with reference to FIGS. 24 and 25 together.

FIG. 21 may be a waveform diagram illustrating example embodiments in which slew rates of the first output signal DN0 and the second output signal DP0 are significantly increased. As an example, example embodiments described with reference to FIG. 21 may be applied when loads of the data lanes L0 and L1, transmitting the first output signal DN0 and the second output signal DP0, are relatively high.

Referring to FIG. 21, a phase of the first input signal IN1 may be opposite to a phase of the second input signal IN2, and a phase of the third input signal IN3 may be opposite to a phase of the fourth input signal IN4. A phase of the first input signal IN1 may be same with a phase of the fourth input signal IN4. Therefore, a phase of the first output signal DN0 may be opposite to a phase of the second output signal DP0.

As an example, the first control signal CTR1 may have the same phase as the first input signal IN1, and the second control signal CTR2 may have the same phase as the third input signal IN3. Therefore, in the first interface circuit 610, when the first switch element SW1 is turned on, the first capacitor C1 may be charged and the first output signal DN0 may be rapidly increased. In addition, when the second switch element SW2 is turned on, the second capacitor C2 may be discharged and the first output signal DN0 may be rapidly decreased. Similarly, in the second interface circuit 620, when the third switch element SW3 is turned on, the third capacitor C3 may be charged and the second output signal DP0 may be rapidly increased. In addition, when the fourth switch element SW4 is turned on, the fourth capacitor C4 may be discharged and the second output signal DP0 may be rapidly decreased.

Figure 24:
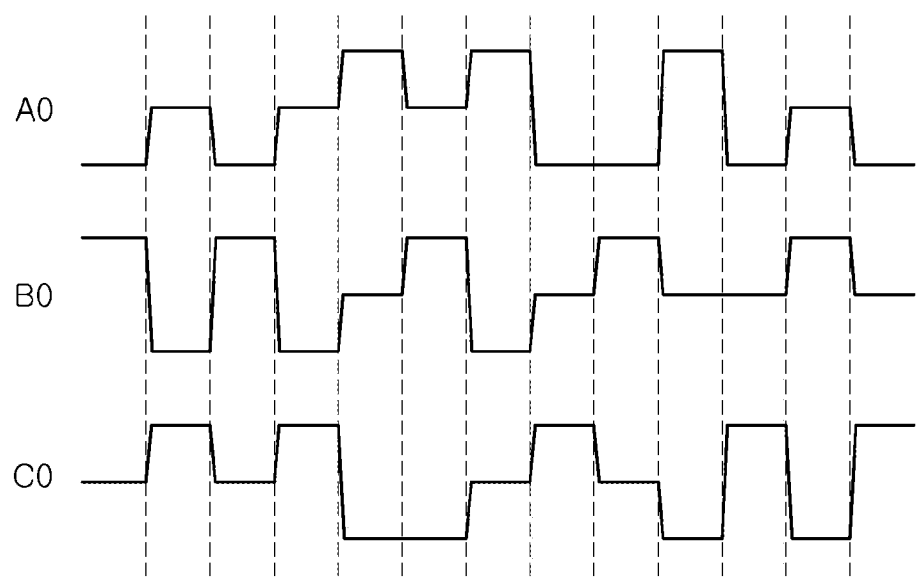
FIGS. 24 to 27 are views illustrating an operation of an interface device according to example embodiments.

As described above, the capacitors C1 to C4 may be controlled to increase an eye margin, as illustrated in FIG. 24. In addition, a time during which received data D0 output by the receiver RX0 has a high level or a low level may be sufficiently secured and the received data D0 may be precisely detected on a reception side.

FIG. 22 may be a waveform diagram illustrating example embodiments in which the slew rates of the first output signal DN0 and the second output signal DP0 are relatively less increased. Referring to FIG. 22, input signals IN1 to IN4 may be the same as described with reference to FIG. 21. In addition, the first control signal CTR1 may have the same phase as the first input signal IN1, and the second control signal CTR2 may have the same phase as the third input signal IN3.

However, in example embodiments illustrated in FIG. 22, the slew rates of the first control signal CTR1 and the second control signal CTR2 may be relatively lower than that in example embodiments described with reference to FIG. 21. For example, the first control signal CTR1 and the second control signal CTR2 may be slowly increased and may be slowly decreased. The slew rates of the first control signal CTR1 and the second control signal CTR2 may be controlled in such a manner to adjust a resistance value of a variable resistor connected to a buffer inputting the first control signal CTR1 and the second control signal CTR2 to the capacitors C1 to C4. As the slew rates of the first control signal CTR1 and the second control signal CTR2 are decreased, the slew rates of the first and second output signals DN0 and DP0 may also be relatively lower than those in example embodiments described with reference to FIG. 21.

As a result, the interface device 600 according to example embodiments may control the slew rates of the output signals DN0 and DP0. As an example, the slew rates of the output signals DN0 and DP0 may be controlled in such a manner to adjust a slew rate of a buffer charging and discharging the capacitors C1 to C4 included in the interface circuits 610 and 620, rather than in such a manner to adjust capacitances of the capacitors C1 to C4. Therefore, unlike the manner to adjust the capacitances of the capacitors C1 to C4, the slew rates of the output signals DN0 and DP0 may be effectively adjusted without increasing capacitance reflected in output nodes ON1 and ON2 of the interface circuits 610 and 620. In addition, the interface circuits 610 and 620 may adjust the slew rates of the output signals DN0 and DP0 in consideration of a load of data lanes L0 and L1, along which the output signals DN0 and DP0 are transmitted, to address an issue such as overshoot occurring in the output signals DN0 and DP0 due to an excessively high slew rate.

Figure 23:
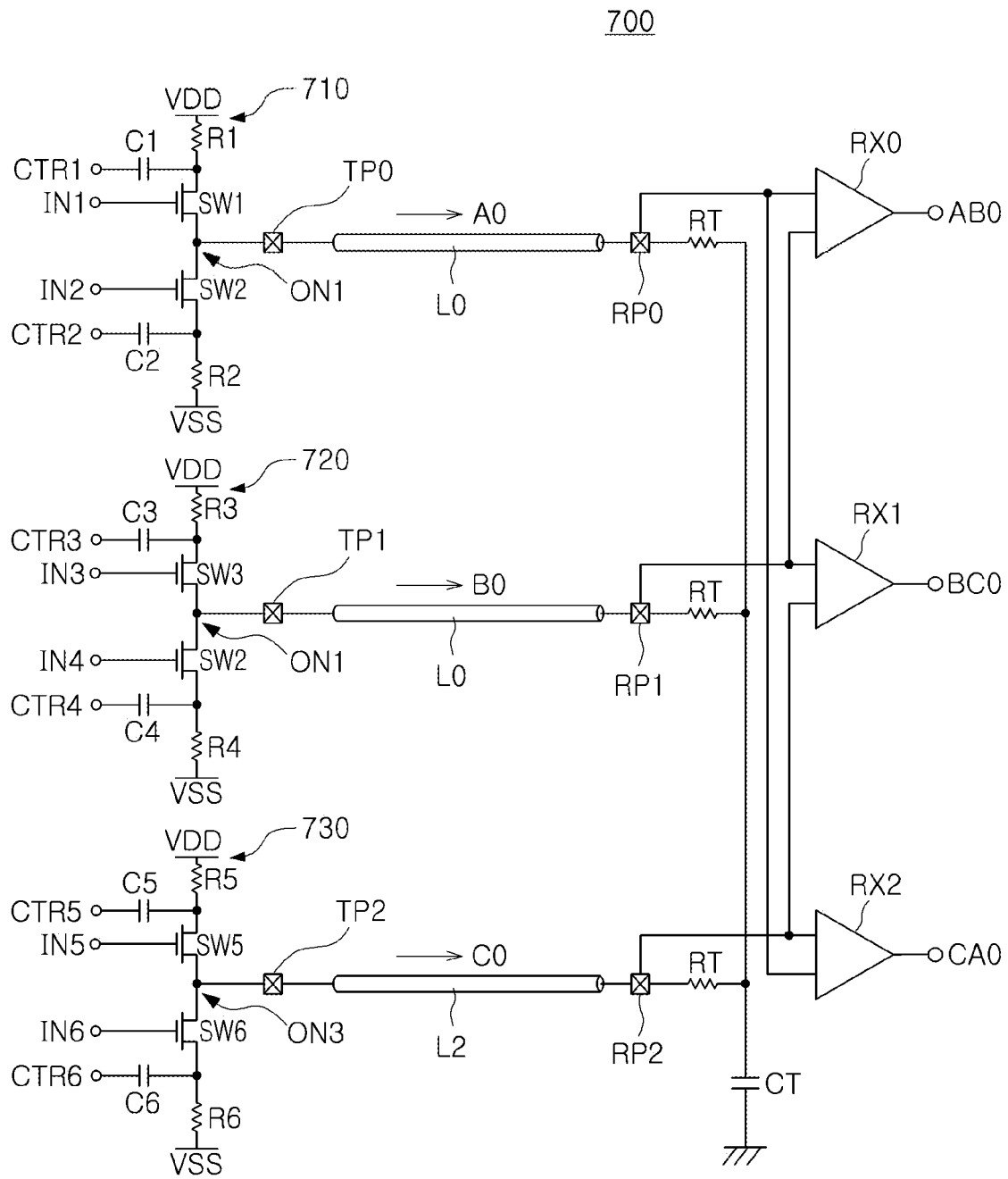
FIG. 23 is a schematic diagram of an interface device according to example embodiments.

FIG. 23 is a schematic diagram of an interface device according to example embodiments. FIGS. 24 to 27 are views illustrating an operation of an interface device according to example embodiments.

Referring to FIG. 23, the interface device 700 according to example embodiments may include a first interface circuit 710 outputting a first output signal A0, a second interface circuit 720 outputting a second output signal B0, and a third interface circuit 730 outputting a third output signal C0. As an example, the interface device 700 may support communication in a C-PHY interface according to the mobile industry processor interface (MIPI) standard. The first to third output signals A0 to C0 may have a high level, a low level, and a mid level, and the first to third output signals A0 to C0 may not have levels different from each other. As an example, when the first output signal A0 is at the high level, one of the second output signal B0 and the third output signal C0 may be at the mid level and the other may be at the low level.

The first output signal A0 may be input to a first reception pad RP0 along a first data lane L0, and the second output signal B0 may be input to a reception pad RP1 along a second data lane L1, and the third output signal C0 may be input to a third reception pad RP2 along a third data lane L2. A termination circuit is connected to each of the reception pads RP0, RP1, and RP2. The termination circuit may include a termination resistor RT and a termination capacitor CT.

First, second, and third receivers RX0, RX1, and RX2 may generate first received data AB0, second received data BC0, and third received data CA0 using the first, second, and third output signals A0, B0, and C0, respectively. The first receiver RX0 may generate first received data AB0 using a difference between the first output signal A0 and the second output signal B0, and the second receiver RX1 may generate the second received data BC0 using a difference between the second output signal B0 and the third output signal C0. The third receiver RX2 may generate the third received data CA0 using a difference between the third output signal C0 and the first output signal A0. In some example embodiments, the first received data AB0, the second received data BC0, and the third received data CA0 may be converted into state information having three bits on a reception side, and symbol information may be generated using a change in the state information.

The first interface circuit 710, the second interface circuit 720, and the third interface circuit 730 may have the same structure. Now, the first interface circuit 710 will be described as an example. The first interface circuit 710 may include a first switch element SW1 and a second switch element SW2, a first resistor R1, and a second resistor R2, a first capacitor C1, a second capacitor C2, and/or the like. The first capacitor C1 may be charged and discharged by a first control signal CTR1, and the second capacitor C2 may be charged and discharged by a second control signal CTR2. In example embodiments illustrated in FIG. 23, capacitors C1 to C6 included in each of the first interface circuit 710, the second interface circuit 720, and the third interface circuit 730 may be charged and discharged by different control signals CTR1 to CTR6.

Hereinafter, the operation of the interface device 700 will be described with reference to FIGS. 24 to 27 together.

Figure 25:
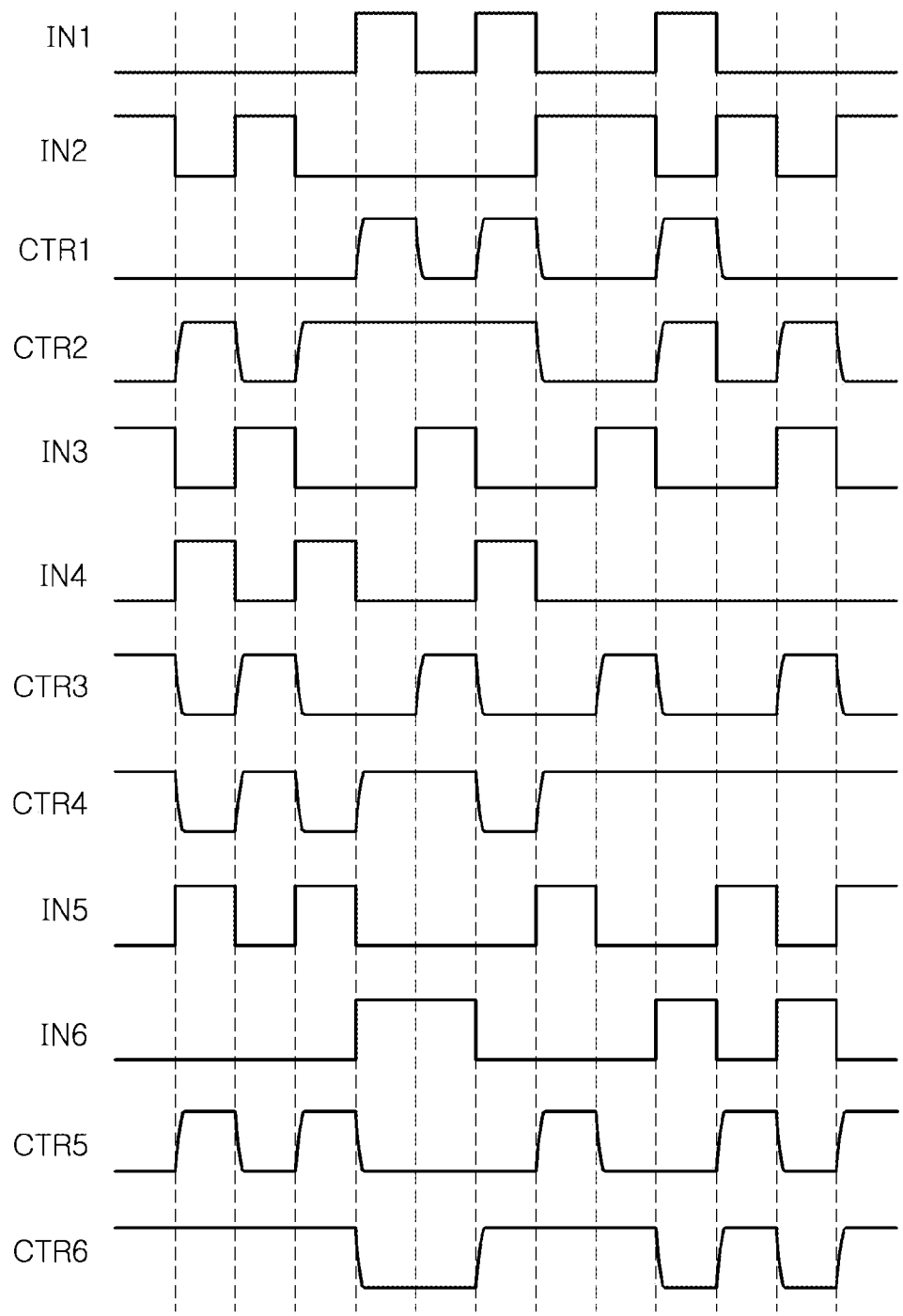

FIGS. 24 and 25 may correspond to some operation embodiments in which slew rates of the first to third output signals A0 to C0 may be significantly increased. Referring to FIG. 24, the magnitude of each of the first to third output signals A0 to C0 may be determined at a high level, a low level, and a mid level, and the first to third output signals A0 to C0 may not have the same level at the same time.

FIG. 25 is a view illustrating input signals IN1 to IN6 and control signals CTR1 to CTR6 corresponding to the first to third output signals A0 to C0 illustrated in FIG. 24. Now, the first interface circuit 710 will be described as an example. The first control signal CTR1 may be the same signal as the first input signal IN1, and the second control signal CTR2 may be a complementary signal of the second input signal IN2. As described above, the first and second control signals CTR1 and CTR2 may be selected to increase a slew rate of the first output signal A0. Similarly, in the second interface circuit 720, the third control signal CTR3 may be the same signal as the third input signal IN3, and the fourth control signal CTR4 may be a complementary signal of the fourth input signal IN4. In example embodiments illustrated in FIGS. 24 and 25, a resistance value of a variable resistor connected to each of the buffers, transmitting the control signals CTR1 to CTR6, may be reduced to increase slew rates of the control signals CTR1 to CTR6. Thus, the slew rates of the first to third output signals A0 to C0 may be significantly increased.

Figure 26:
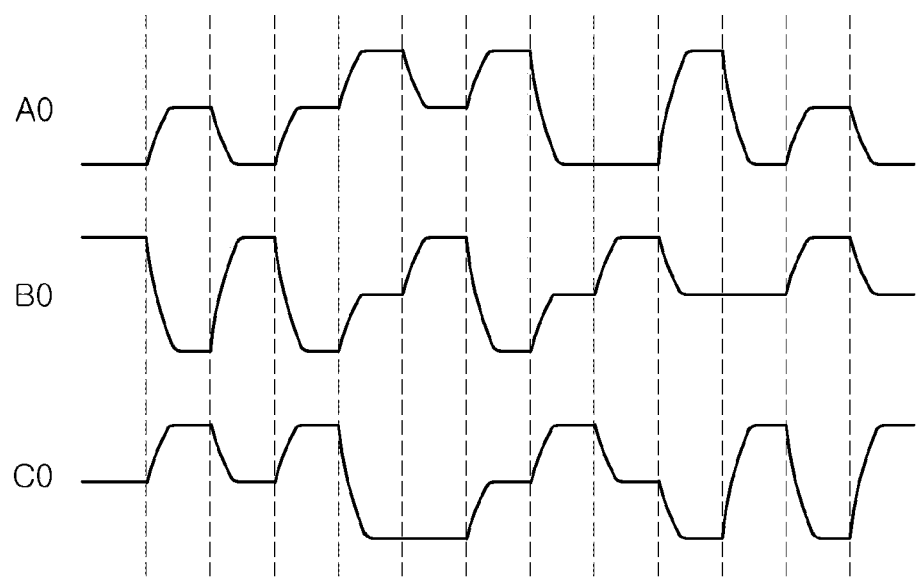
Figure 27:
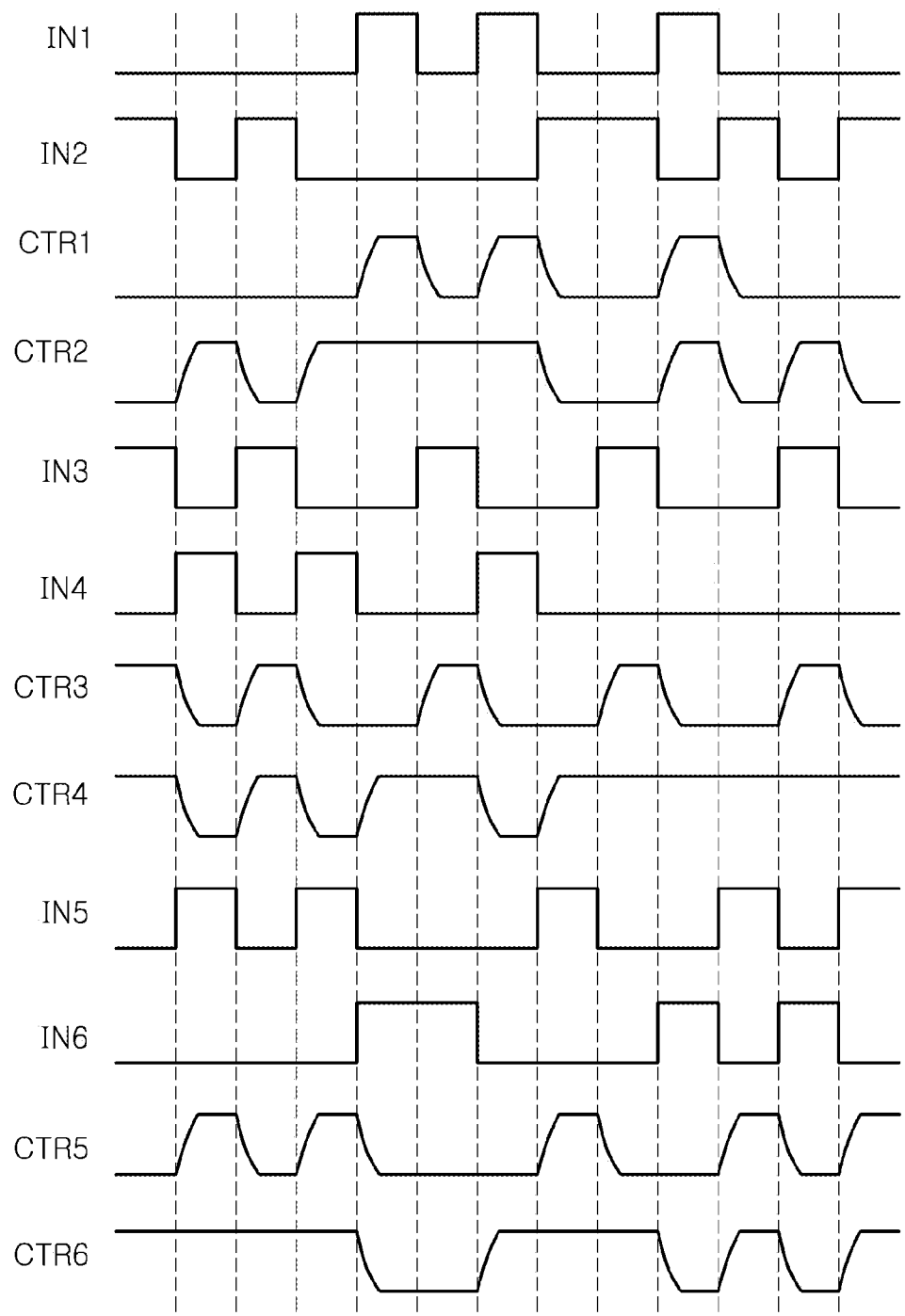

FIGS. 26 and 27 may correspond to operation embodiments in which the slew rates of the first to third output signals A0 to C0 may be decreased. Referring to FIG. 26, each of the first to third output signals A0 to C0 may have a high level, a low level, and a mid level, and the first to third output signals A0 to C0 may not have the same level at the same time.

FIG. 27 is a view illustrating input signals IN1 to IN6 and control signals CTR1 to CTR6 corresponding to the first to third output signals A0 to C0 illustrated in FIG. 26. Now, the first interface circuit 710 will be described as an example. The first control signal CTR1 may be the same signal as the first input signal IN1, and the second control signal CTR2 may be a complementary signal of the second input signal IN2.

Unlike what was described with reference to FIGS. 24 and 25, in example embodiments illustrated in FIG. 27, a resistance value of a variable resistor connected to each of the buffers, transmitting the control signals CTR1 to CTR6, may be increased. Accordingly, slew rates of the control signals CTR1 to CTR6 may be decreased, and slew rates of the first to third output signals A0 to C0 may be set to be relatively lower than those in example embodiments illustrated in FIGS. 24 and 25. As an example, when loads of data lanes L0 to L2 are not high, the slew rate of the first to third output signals A0 to C0 may be set to be relatively low, as described with reference to FIGS. 26 and 27, to reduce or prevent overshoot of the first to third output signals A0 to C0.

Figure 28:
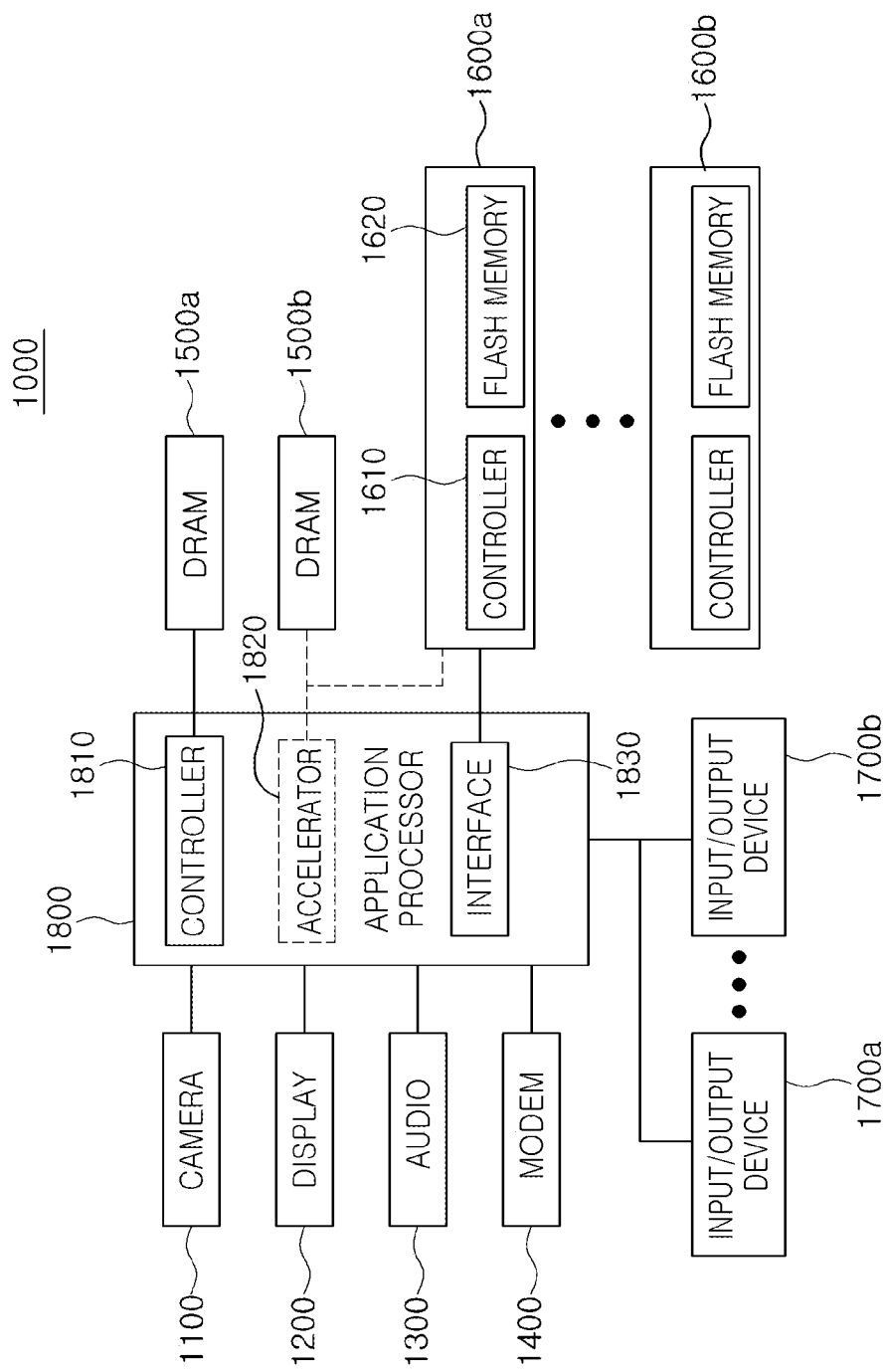
FIG. 28 is a schematic block diagram of an electronic device including an interface device according to example embodiments.

FIG. 28 is a schematic block diagram of an electronic device including an interface device according to example embodiments.

Referring to FIG. 28, a mobile system 1000 may include a camera 1100, a display 1200, an audio processing unit 1300, a modem 1400, DRAMs 1500a and 1500b, and flash memory devices 1600a and 1600b, input/output (I/O) devices 1700a and 1700b, and/or an application processor (hereinafter referred to as "AP") 1800.

The mobile system 1000 may be implemented as a laptop computer, a portable terminal, a smartphone, a tablet personal computer (table PC), a wearable device, a healthcare device, or an Internet-of-Things (IoT) device. Also, the mobile system 1000 may be implemented as a server or a PC.

The camera 1100 may capture a still image or a video under the user's control. The mobile system 1000 may obtain specific information using a still image/video captured by the camera 1100, or may convert and store the still image/video into other types of data such as text. Alternatively, the mobile system 1000 may recognize a character string included in the still image/video captured by the camera 1100, and may provide a text or audio translation corresponding to the character string. As described above, the camera 1100 in the mobile system 1000 tends to be used in various fields of application. In some example embodiments, the camera 1100 may transmit data, such as a still image/video, to the AP 1800 according to a D-PHY or C-PHY interface in the MIPI standard.

The display 1200 may be implemented in various forms such as a liquid crystal display (LCD), an organic light emitting diodes (OLED) display, an active-matrix organic light emitting diodes (AMOLED) display, a plasma display panel (PDP), a field emission display (FED), an electronic paper, and/or the like. In some example embodiments, the display 1200 may provide a touchscreen function to be also used as an input device of the mobile system 1000. In addition, the display 1200 may be integrated with a fingerprint sensor, or the like, to provide a security function of the mobile system 1000. In some example embodiments, the AP 1800 may transmit image data, to be displayed on the display 1200 according to the D-PHY or C-PHY interface in the MIPI standard, to the display 1200.

The interface devices, described with reference to example embodiments, may be applied to communications between the AP 1800 and the display 1200 and communications between the AP 1800 and the camera 1100. At least one of the AP 1800, the display 1200, and the camera 1100 may appropriately select a control signal charging and discharging a capacitor included in the interface device, as necessary, to increase or decrease a slew rate of an output signal output by the interface device.

As an example, a slew rate of the output signal, output by the interface device, may be increased to increasing a data transmission rate between the AP 1800 and the display 1200 and/or between the AP 1800 and the camera 1100 and to improve noise characteristics. In addition, the slew rate of the output signal, output by the interface device, may be increased to significantly reduce an effect of communications between the AP 1800 and the display 1200 and/or communications between the AP 1800 and the camera 1100 on other components and to reduce power consumption.

The audio processing unit 1300 may process audio data, stored in flash memory devices 1600a and 1600b, or audio data included in contents externally received through a modem 1400 or the I/O devices 1700a and 1700b. For example, the audio processing unit 1300 may perform various processes such as coding/decoding, amplification, and noise filtering, or the like, on the audio data.

The modem 1400 may modulate a signal and transmit the modulated signal to transmit and receive wired/wireless data, and may demodulate an externally received signal to restore an original signal. The I/O devices 1700a and 1700b may provide digital input and output, and may include an input device, such as a port connectable to an external recording medium, a touchscreen, or a mechanical button key, and an output device, capable of outputting a vibration in a haptic manner. In certain examples, the I/O devices 1700a and 1700b may be connected to an external recording medium through a port such as a USB, a lightning cable, an SD card, a micro SD card, a DVD, a network adapter, or the like.

The AP 1800 may control the overall operation of the mobile system 1000. For example, the AP 1800 may control the display 1200 to display a portion of the contents, stored in the flash memory devices 1600*a* and 1600*b*, on a screen. When a user input is received through the I/O devices 1700*a* and 1700*b*, the AP 1800 may perform a control operation corresponding to the user input.

The AP 1800 may be provided as a system-on-chip (SoC) driving an application program, an operating system (OS), or the like. In addition, the AP 1800 may be included in a single semiconductor package together with other devices included in the mobile system 1000, for example, a DRAM 1500*a*, a flash memory 1620, and/or a memory controller 1610. For example, the AP 1800 and at least one device may be provided in a package form such as Package on Package (PoP), Ball grid arrays (BGAs), Chip scale packages (CSPs), System In Package (SIP), Multi Chip Package (MCP), Wafer-level Fabricated Package (WFP), Wafer-In the form of a package such as a Level Processed Stack Package (WSP). A kernel of the operating system, driven on the AP 1800, may include an input/output scheduler and a device driver for controlling the flash memory devices 1600*a* and 1600*b*. The device driver may control access performance of the flash memory devices 1600*a* and 1600*b* with reference to the number of synchronous queues managed by the input/output scheduler, or may control a CPU mode inside the SoC, a dynamic voltage and frequency scaling (DVFS) level, and the like.

In some example embodiments, the AP 1800 may include a processor block, executing an operation or driving an application program and/or an operating system, and various other peripheral elements connected through a system block and a system bus. The peripheral elements may include a memory controller, an internal memory, a power management block, an error detection block, a monitoring block, and/or the like. The processor block may include one or more cores. When a plurality of cores are included in the processor block, each of the cores includes a cache memory and a common cache, shared by the cores, may be included in the processor block.

In some example embodiments, the AP 1800 may include an accelerator block 1820, a specific-purpose circuit for AI data operation. Alternatively, according to example embodiments, a separate accelerator chip may be provided to be separated from the AP 1800, and a DRAM 1500*b* may be additionally connected to the accelerator block 1820 or an accelerator chip. The accelerator block 1820 may be a functional block specialized in performing specific functions of the AP 1800, and may include a graphics processing unit (GPU) serving as a functional block specialized in processing graphics data, a neural processing unit (NPU) serving as a functional block specialized in performing AI computation and interference, a data processing unit (DPU) serving as a functional block specialized in transmitting data, or the like.

According to example embodiments, the mobile system 1000 may include a plurality of DRAMs 1500*a* and 1500*b*. In some example embodiments, the AP 1800 may include a controller 1810 for controlling the DRAM 1500*a* and 1500*b*, and the DRAM 1500*a* may be directly connected to the AP 1800.

The AP 1800 may set a command and a mode register set (MRS) command according to the JEDEC standard to control a DRAM, or may set specifications and functions required by the mobile system 1000, such as a low voltage, high speed, and reliability, and a DRAM interface protocol for CRC/ECC to perform communications. For example, the AP 1800 may communicate with the DRAM 1500*a* through an interface in compliance with JEDEC standards such as LPDDR4, LPDDR5, or the like. Alternatively, the AP 1800 may set a new DRAM interface protocol to control the DRAM 1500*b* for an accelerator, in which an accelerator block 1820 or an accelerator chip provided independently of the AP 1800 has a higher bandwidth than the DRAM 1500*a*, to perform communications.

Only the DRAMs 1500*a* and 1500*b* are illustrated in FIG. 28, but a configuration of the mobile system 1000 is not necessarily limited thereto. According to bandwidth and reaction speed of the AP 1800 and the accelerator block 1820 and voltage conditions, memories other than the DRAMS 1500*a* and 1500*b* may be included in the mobile system 1000. As an example, the controller 1810 and/or the accelerator block 1820 may control various memories such as PRAM, SRAM, MRAM, RRAM, FRAM, Hybrid RAM, and/or the like. The DRAMs 1500*a* and 1500*b* have relatively lower latency and higher bandwidth than input/output devices 1700*a* and 1700*b* or flash memory devices 1600*a* and 1600*b*. The DRAMs 1500*a* and 1500*b* may be initialized at a power-on point in time of the mobile system 1000. When an operating system and application data are loaded, the DRAMs 1500*a* and 1500*b* may be used as locations, in which the operating system and application data are temporarily stored, or as spaces in which various software codes are executed.

Four fundamental arithmetic operations such as addition, subtraction, multiplication, and division and a vector operation, an address operation, or FFT operation data may be stored in the DRAMs 1500*a* and 1500*b*. In other example embodiments, the DRAMs 1500*a* and 1500*b* may be provided as a processing in memory (PIM) having an operational function. For example, a function used to perform inference in the DRAMs 1500*a* and 1500*b* may be performed. In some example embodiments, the inference may be performed in a deep learning algorithm using an artificial neural network. The deep learning algorithm may include a training operation, in which a model is learned through various data, and an inference operation in which data is recognized with the trained model. For example, a function used in the inference may include a hyperbolic tangent function, a sigmoid function, a rectified linear unit (ReLU) function, or the like.

As an example embodiment, an image captured by a user through the camera 1100 may be signal-processed and then stored in the DRAM 1500*b*, and the accelerator block 1820 or the accelerator chip may perform an AI data operation, using the data stored in the DRAM 1500*b* and the function used in the inference, to recognize data.

According to example embodiments, the mobile system 1000 may include a plurality of storage or a plurality of flash memory devices 1600*a* and 1600*b* having capacity higher than capacity of the DRAMs 1500*a* and 1500*b*. The flash memory devices 1600*a* and 1600*b* may include a controller 1610 and a flash memory 1620. The controller 1610 may receive a control command and data from the AP 1800, and may write data to the flash memory 1620 in response to the control command or may read data stored in the flash memory 1620 and transmit the read data to the AP 1800.

According to example embodiments, the accelerator block 1820 or the accelerator chip may perform a training operation and an AI data operation using the flash memory devices 1600*a* and 1600*b*. As an example embodiment, an operational logic, capable of performing a predetermined or alternatively, desired operation in the flash memory devices 1600a and 1600b, may be implemented in the controller 1610. Instead of the AP 1800 and/or the accelerator block 1820, the operational logic may perform at least a portion of the training operation and the inference, performed by the AP 1800 and/or the accelerator block 1820, using the data stored in the flash memory 1620.

In some example embodiments, the AP 1800 may include an interface 1830. Accordingly, the flash memory devices 1600a and 1600b may be directly connected to the AP 1800. For example, the AP 1800 may be implemented as an SoC, the flash memory device 1600a may be implemented as a chip independently of the AP 1800, and the AP 1800 and the flash memory device 1600a may be mounted in a single package. However, example embodiments are not limited thereto, and the plurality of flash memory devices 1600a and 2600b may be electrically connected to the mobile system 1000 through a connection.

The flash memory devices 1600a and 1600b may stores data such as a still image/video, captured by the camera 1100, or data received through a communications network and/or a ports included in the input and output devices 1700a and 1700b. For example, the flash memory devices 1600a and 1600b may store augmented reality/virtual reality, high definition (HD) or ultra high definition (UHD) contents.

Any of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

As described above, according to example embodiments, a slew rate of an output signal output by an interface circuit may be adjusted by connecting a capacitor to each switch element of an interface circuit and adjusting a slew rate of a control signal charging and discharging the capacitor.

While example embodiments have been shown and described above, it will be apparent to those skilled in the art that modifications and variations could be made without departing from the scope of the present inventive concepts as defined by the appended claims.

What is claimed is:

1. An interface circuit comprising:
   a first switch element connected to a first power supply node, supplying a first power supply voltage, and an output node, transmitting an output signal, and controlled by a first input signal;
   a second switch element connected to a second power supply node, supplying a second power supply voltage, lower than the first power supply voltage, and the output node and controlled by a second input signal, different from the first input signal;
   a first resistor connected between the first power supply node and the first switch element;
   a second resistor connected between the second power supply node and the second switch element;
   a first capacitor connected to a first node between the first resistor and the first switch element and charged and discharged by a first control signal;
   a second capacitor connected to a second node between the second resistor and the second switch element and charged and discharged by a second control signal; and
   a buffer circuit configured to output the first control signal and the second control signal and connected to a third power supply node, supplying a third power supply voltage, through a first variable resistor and connected to a fourth power supply node, supplying a fourth power supply voltage, lower than the third power supply voltage, through a second variable resistor.

2. The interface circuit of claim 1, wherein a phase of the first input signal is opposite to a phase of the second input signal.

3. The interface circuit of claim 2, wherein the first input signal and the first control signal have the same phase.

4. The interface circuit of claim 3, wherein the first control signal and the second control signal are the same signal.

5. The interface circuit of claim 2, wherein each of the first switch element and the second switch element is an NMOS transistor.

6. The interface circuit of claim 1, wherein each of the first variable resistor and the second variable resistor include a plurality of transistors connected to each other in parallel.

7. The interface circuit of claim 6, wherein at least some of the plurality of transistors are simultaneously turned off by a single gate signal.

8. The interface circuit of claim 1, wherein the first input signal and the second input signal are the same signal, and
   the first switch element is a PMOS transistor, and the second switch element is an NMOS transistor.

9. The interface circuit of claim 8, wherein the buffer circuit includes a first buffer, configured to output the first control signal, and a second buffer configured to output the second control signal.

10. The interface circuit of claim 9, wherein a phase of the first control signal is same as a phase of the first input signal and a phase of the second control signal is opposite to the phase of the first input signal.

11. The interface circuit of claim 1, wherein a magnitude of the output signal has a first level, a second level higher than the first level, and a third level higher than the second level.

12. The interface circuit of claim 11, wherein the first capacitor is charged when the magnitude of the output signal is increased from the first level to the second level, the second capacitor is charged when the magnitude of the output signal is increased from the second level to the third level, and the first capacitor and the second capacitor are simultaneously charged when the magnitude of the output signal is increased from the first level to the third level.

13. The interface circuit of claim 11, wherein the first capacitor is discharged when the magnitude of the output signal is decreased from the second level to the first level, the second capacitor is discharged when the magnitude of the output signal is decreased from the third level to the second level, and the first capacitor and the second capacitor are simultaneously discharged when the magnitude of the output signal is decreased from the third level to the first level.

14. The interface circuit of claim 1, wherein a magnitude of the output signal has a first level and a second level higher than the first level.

15. The interface circuit of claim 14, wherein the first capacitor and the second capacitor are charged when the magnitude of the output signal is increased from the first level to the second level, and the first capacitor and the second capacitor are discharged when the magnitude of the output signal is decreased from the second level to the first level.

16. An interface device comprising:
a plurality of interface circuits, each including a first switch element and a second switch element, connected to each other in series, a first capacitor connected to a first node between the first switch element and a first power supply node, a second capacitor connected to a second node between the second switch element and a second power supply node, and a buffer configured to output a first control signal for controlling the first capacitor and a second control signal for controlling the second capacitor, the buffer connected to a third power supply node, supplying a third power supply voltage, through a first variable resistor and connected to a fourth power supply node, supplying a fourth power supply voltage, lower than the third power supply voltage, through a second variable resistor; and
a controller configured to control the first switch element and the second switch element to determine an output signal of each of the plurality of interface circuits and configured to adjust a slew rate of a control signal, output to the first capacitor and the second capacitor, to determine a slew rate of the output signal.

17. The interface device of claim 16, wherein
the controller is configured to adjust a resistance of the first and second variable resistors to adjust the slew rate of the control signal.

18. The interface device of claim 17, wherein the controller is configured to adjust the slew rate of the control signal, based on a load of a channel connected to an output node between the first switch element and the second switch element.

19. An interface circuit comprising:
a first switch element configured to receive a first power supply voltage from a first power supply node and turned on and turned off by a first input signal;
a second switch element configured to receive a second power supply voltage, lower than the first power supply voltage, from a second power supply node and turned on and turned off by a second input signal;
a first capacitor having a first node, connected to a first common node between the first switch element and the first power supply node, and a second node receiving a control signal having the same phase as the first input signal;
a second capacitor having a first node, connected to a second common node between the second switch element and the second power supply node, and a second node receiving the control signal; and
a buffer circuit configured to output the control signal to the first capacitor and the second capacitor, the buffer circuit including a first variable resistor and a second variable resistor,
wherein a slew rate of an output signal, output from an output node on which the first switch element and the second switch element are connected to each other, is determined by a slew rate of the control signal.

20. The interface circuit of claim 19, wherein the slew rate of the output signal is increased when the slew rate of the control signal is increased, and is decreased when the slew rate of the control signal is decreased.

\* \* \* \* \*